United States Patent
Na et al.

(10) Patent No.: US 10,698,513 B2
(45) Date of Patent: Jun. 30, 2020

(54) DISPLAY MODULE INCLUDING TOUCH SENSING ELECTRODES OF DIFFERENT SIZES

(71) Applicant: Samsung Display Co., Ltd., Yongin-si (KR)

(72) Inventors: Hyunjae Na, Seoul (KR); Jaseung Ku, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 142 days.

(21) Appl. No.: 15/711,085

(22) Filed: Sep. 21, 2017

(65) Prior Publication Data
US 2018/0164931 A1    Jun. 14, 2018

(30) Foreign Application Priority Data
Dec. 12, 2016 (KR) .................. 10-2016-0168817

(51) Int. Cl.
*G06F 3/041* (2006.01)
*G06F 3/044* (2006.01)
*H01L 51/52* (2006.01)
*H01L 27/32* (2006.01)

(52) U.S. Cl.
CPC ............ *G06F 3/0412* (2013.01); *G06F 3/044* (2013.01); *H01L 27/323* (2013.01); *H01L 51/5203* (2013.01)

(58) Field of Classification Search
CPC ..................................................... H01L 27/323
See application file for complete search history.

(56) References Cited

U.S. PATENT DOCUMENTS

| 9,069,411 | B2 | 6/2015 | Chang |
| 9,383,849 | B2 | 7/2016 | Hur |
| 9,557,854 | B2 | 1/2017 | Hashimoto |
| 2012/0262385 | A1* | 10/2012 | Kim .................. G06F 3/044 345/173 |
| 2013/0285975 | A1 | 10/2013 | Hong et al. |

(Continued)

FOREIGN PATENT DOCUMENTS

| EP | 2 985 684 | 2/2016 |
| KR | 10-2013-0120815 | 11/2013 |

(Continued)

OTHER PUBLICATIONS

Extended European Search Report dated May 7, 2018, in European Patent Application No. 17205598.0.

*Primary Examiner* — Gustavo Polo
(74) *Attorney, Agent, or Firm* — H.C. Park & Associates, PLC

(57) ABSTRACT

A display module includes a display panel and an input sensing unit. The display panel includes a base surface. The input sensing unit is directly disposed on the base surface. The input sensing unit includes a first electrode, a second electrode, and an insulation layer. The first electrode extends in a first direction. The first electrode includes a first opening area. The second electrode extends in a second direction intersecting the first direction. The second electrode is longer than the first electrode. The second electrode includes a second opening area of a size greater than a size of the first opening area. The insulation layer is configured to insulate the first electrode from the second electrode.

20 Claims, 21 Drawing Sheets

(56) References Cited

U.S. PATENT DOCUMENTS

2014/0054070 A1 2/2014 Ichiki
2015/0293634 A1* 10/2015 Her .................. G06F 3/044
                                                                     345/174
2015/0324027 A1 11/2015 Heo et al.

FOREIGN PATENT DOCUMENTS

KR    10-2014-0096507    8/2014
KR    10-1624391    5/2016

* cited by examiner

DISPLAY MODULE INCLUDING TOUCH SENSING ELECTRODES OF DIFFERENT SIZES

CROSS-REFERENCE TO RELATED APPLICATION

This application claims priority from and the benefit of Korean Patent Application No. 10-2016-0168817, filed Dec. 12, 2016, which is hereby incorporated by reference for all purposes as if fully set forth herein.

BACKGROUND

Field

The disclosure generally relates to a display module, and, more particularly, to a display module including an input sensing unit directly disposed on a display panel.

Discussion

Display devices can be used in various multimedia devices, such as a television, a mobile phone, a tablet computer, a navigation device, a game player, etc. A display device may include a keyboard, mouse, etc., as an input device. In addition, the display device may be provided with a touch panel as the input device.

The above information disclosed in this section is only for enhancement of an understanding of the background of the inventive concepts, and, therefore, it may contain information that does not form prior art already known to a person of ordinary skill in the art.

SUMMARY

Some exemplary embodiments are capable of providing an input sensing unit-integrated display module with enhanced sensitivity.

Additional aspects will be set forth in the detailed description which follows, and, in part, will be apparent from the disclosure, or may be learned by practice of the inventive concepts.

According to some exemplary embodiments, a display module includes a display panel and an input sensing unit. The display panel includes a base surface. The input sensing unit is directly disposed on the base surface. The input sensing unit includes a first electrode, a second electrode, and an insulation layer. The first electrode extends in a first direction. The first electrode includes a first opening area. The second electrode extends in a second direction intersecting the first direction. The second electrode is longer than the first electrode. The second electrode includes a second opening area of a size greater than a size of the first opening area. The insulation layer is configured to insulate the first electrode from the second electrode.

According to some exemplary embodiments, a display module includes a display panel and an input sensing unit. The display panel provides a base surface. The input sensing unit is directly disposed on the base surface. The input sensing unit includes a first electrode and a second electrode. The first electrode extends in a first direction. The first electrode includes a first outline area and a first opening area. The second electrode extends in a second direction intersecting the first direction. The second electrode includes a second outline area of a size greater than a size of the first outline area, and a second opening area of a size greater than a size of the first opening area.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1A:
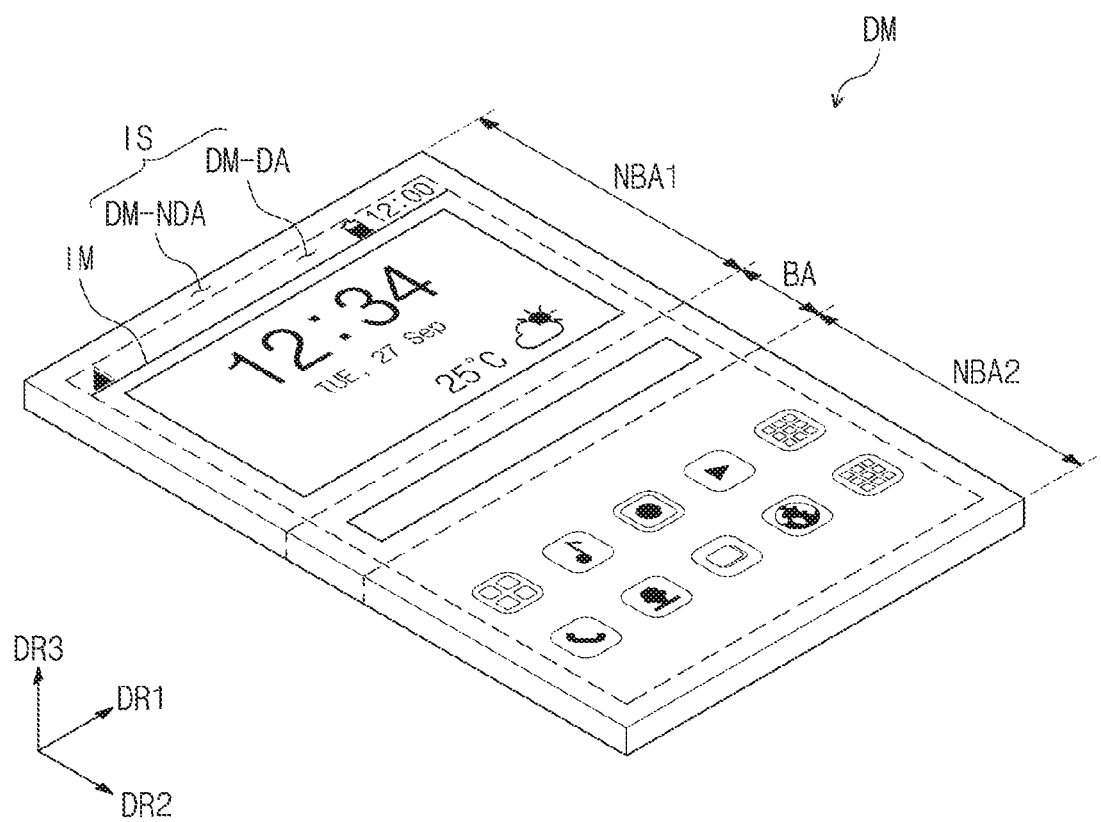
FIGS. 1A, 1B, and 1C are perspective views of a display module according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be implemented in another exemplary embodiment without departing from the spirit and the scope of the disclosure.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as "elements"), of the various illustrations may be otherwise combined, separated, interchanged, and/or rearranged without departing from the spirit and the scope of the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Further, the DR1-axis, the DR2-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings are schematic in nature and shapes of these regions may not illustrate the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1B:
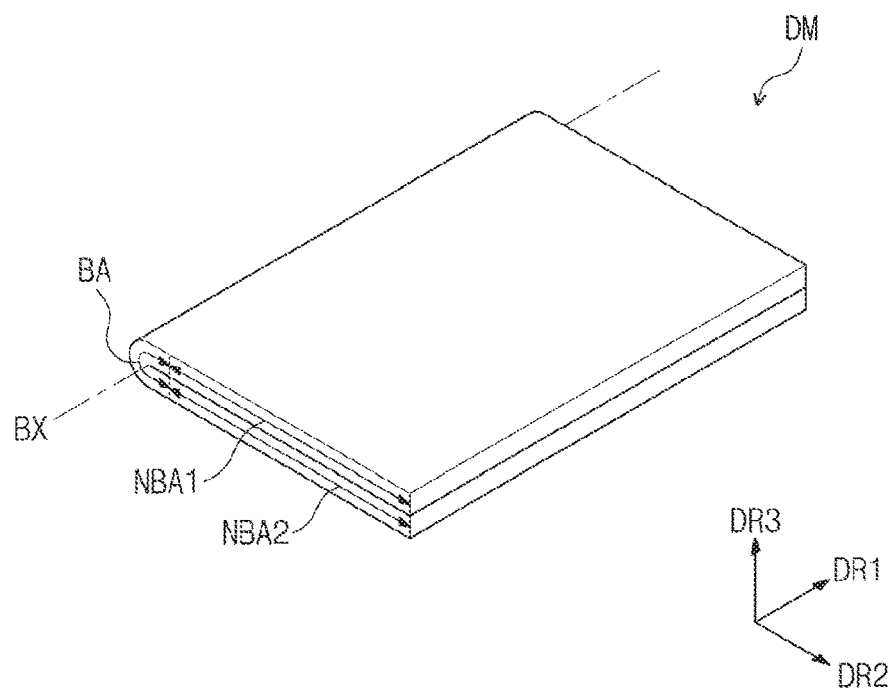
Figure 1C:
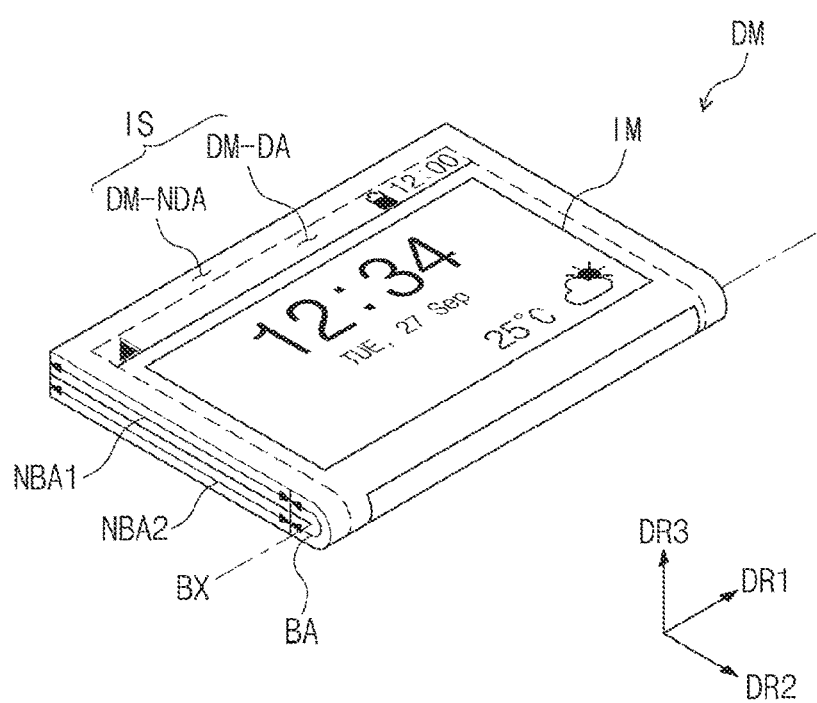

FIGS. 1A, 1B, and 1C are perspective views of a display module according to some exemplary embodiments.

As illustrated in FIGS. 1A to 1C, a display surface IS on which an image IM is displayed is parallel to a surface defined by a first directional axis DR1 and a second directional axis DR2. The normal direction of the display surface IS, namely, the thickness direction of the display module DM, extends in a third directional axis DR3. A front surface (or top surface) and a rear surface (or bottom surface) of each member are distinguished by the third directional axis DR3. However, directions indicated by the first to third directional axes DR1, DR2, and DR3 correspond to a relative concept and may be changed to other directions. Hereinafter, the first to third directions are directions respectively indicated by the first to third directional axes DR1, DR2, and DR3, and refer to the same reference numerals.

As illustrated in FIGS. 1A to 1C, the display module DM may include a plurality of areas defined according to an operation type. The display module DM may include a bending area BA bended on the basis of a bending axis BX, a first non-bending area NBA1 and a second non-bending area NBA2 that are not bended. As illustrated in FIG. 1B, the display module DM may be inner-bended such that the display surface IS of the first non-bending area NBA1 and the display surface IS of the second non-bending area NBA2 face each other. As illustrated in FIG. 1C, the display module DM may be outer-bended such that the display surface IS is exposed externally. As illustrated in FIGS. 1A to 1C, a display module DM in which the bending and unbending are repeated may be defined as a foldable display module DM.

The display module DM in some exemplary embodiments may include a plurality of bending areas BA. In addition, the bending area BA may be defined to correspond to a type that enables a user to manipulate the display module DM. For example, unlike in FIGS. 1B and 1C, the bending area BA may be defined to be parallel to the second directional axis DR2 or defined in a diagonal direction. The area of the bending area BA may not be fixed, but may be determined according to the radius of curvature. The display module DM in some exemplary embodiments may be configured such that only an operation mode illustrated in FIGS. 1A and 1B is repeated.

The foldable display module DM is illustrated according to some exemplary embodiments, but exemplary embodiments are not limited thereto or thereby. The display module DM may include a three dimensional display surface (multilateral pillar type display surface) including a curved surface or a plurality of display areas indicating (or providing viewing surfaces in) different directions. In addition, the display module DM in some exemplary embodiments may be a flat rigid display module. In addition, the display module DM may be a bended type display module of which an edge area is bended.

Although the display module DM is illustrated as being applied to a mobile phone, exemplary embodiments are not limited thereto or thereby. The display module DM, in some exemplary embodiments, may be applied to a large electronic device, such as a television or a monitor, or a small and/or medium electronic device, such as a tablet, a vehicle navigation device, a game player, a smart watch, etc.

As illustrated in FIGS. 1A to 1C, the display surface IS includes a display area DM-DA on which an image IM is displayed and a non-display area DM-NDA adjacent to the display area DM-DA. The non-display area DM-NDA is an area on which the image is not displayed. As an example of the image IM, icon images are illustrated in FIGS. 1A to 1C. As an example, the display area DM-DA may have a rectangular shape. The non-display area DM-NDA may surround the display area DM-DA. However, exemplary embodiments are not limited thereto or thereby, and the shapes of the display area DM-DA and the non-display area DM-NDA may be relatively designed.

Figure 2:
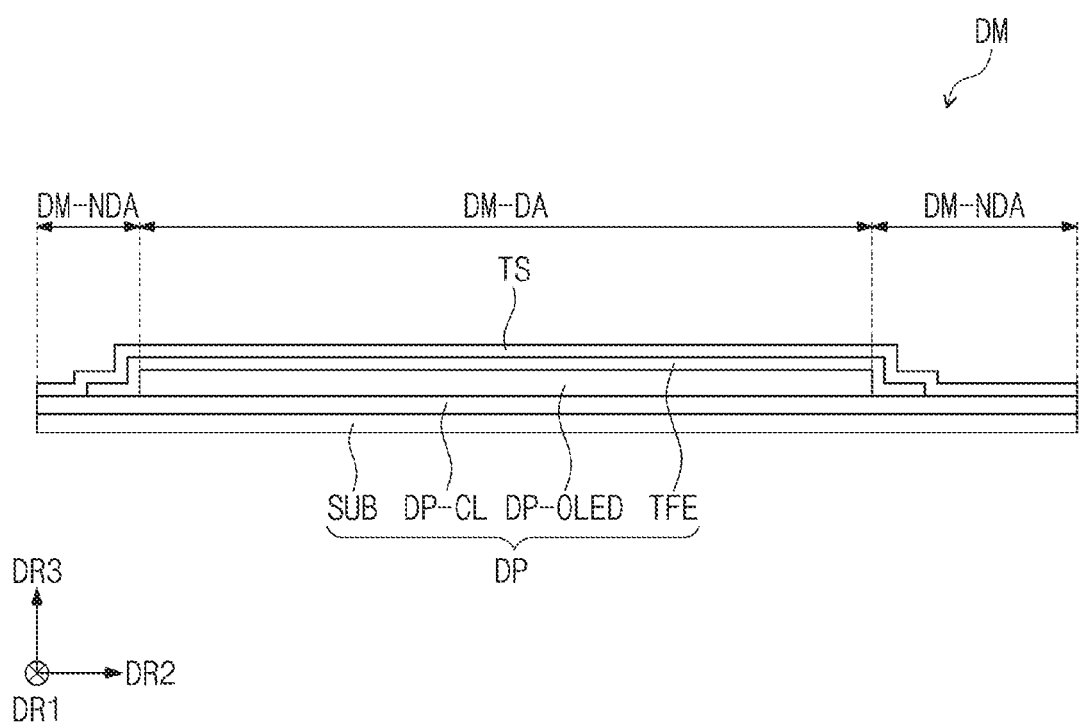
FIG. 2 is a cross-sectional view of the display module of FIG. 1 according to some exemplary embodiments.

FIG. 2 is a cross-sectional view of the display module of FIG. 1 according to some exemplary embodiments. That is, FIG. 2 illustrates a cross-section of the display module DM defined by the second directional axis DR2 and the third directional axis DR3.

As illustrated in FIG. 2, the display module DM includes a display panel DP and an input sensing unit TS (or touch sensing layer). The display panel DP generates an image and the input sensing unit TS acquires coordinate information about an external input (touch event). Although not illustrated separately, the display module DM according to some exemplary embodiments may further include a protection member disposed on the bottom surface of the display panel DP and a reflection preventing member and/or a window member disposed on the top surface of the input sensing unit TS.

The display panel DP may be a light emitting type display panel, however, exemplary embodiments are not limited thereto or thereby. For example, the display panel DP may be an organic light emitting display panel or a quantum dot light emitting display panel. A light emitting layer of the organic light emitting display panel includes an organic light emitting material. A light emitting layer of the quantum dot light emitting display panel includes a quantum dot and a quantum rod. Hereinafter, the display panel DP will be described as an organic light emitting display panel.

The display panel DP includes a base layer SUB, a circuit element layer DP-CL disposed on the base layer SUB, a display element layer DP-OLED, and a thin film encapsulation layer TFE. Although not illustrated separately, the display panel DP may further include a functional layer, such as a reflection preventing layer or a refractive index adjusting layer.

The base layer SUB may include a flexible film. The base layer SUB may include a plastic substrate, a glass substrate, a metal substrate, or an organic/inorganic compound material substrate, etc. The display area DM-DA and non-display area DM-NDA described in relation to FIGS. 1A to 1C may be identically defined on the base layer SUB.

As will become more apparent below, the circuit element layer DP-CL includes at least one intermediate insulation layer and a circuit element. The intermediate insulation layer includes at least one intermediate inorganic layer and at least one intermediate organic layer. The circuit element includes signal lines and a driving circuit of a pixel, etc. The circuit element layer DP-CL may be disposed through an insulation layer disposing process, such as coating or deposition process and a patterning process for a conductive layer and/or a semiconductor layer via a photolithography process.

The display element layer DP-OLED may include an organic light emitting diode. The display element layer DP-OLED may further include an organic layer, such as a pixel definition layer.

The thin film encapsulation layer TFE encapsulates the display element layer DP-OLED. The thin film encapsulation layer TFE includes at least one inorganic layer (hereinafter, an encapsulation inorganic layer). The thin film encapsulation layer TFE may further include at least one organic layer (hereinafter, an encapsulation organic layer). The encapsulation inorganic layer protects the display element layer DP-OLED from moisture, oxygen, etc., and protects the display element layer DP-OLED from a foreign material, such as a dust particle or other debris. The encapsulation inorganic layer may include a silicon nitride layer, a silicon oxy-nitride layer and a silicon oxide layer, a titanium oxide layer, or an aluminum oxide layer, etc. The encapsulation inorganic layer may include an acrylic-based inorganic layer, but exemplary embodiments are not limited thereto or thereby.

The input sensing unit TS may be directly disposed on a base surface provided by the display panel DP. For the purposes of this disclosure, being "directly disposed" means exclusion of being attached using a separate adhesive layer, and means being disposed by a continuous process. The base surface may be the top surface of the thin film encapsulation layer TFE or of another function layer disposed on the thin film encapsulation layer TFE. The base surface is not limited thereto or thereby, and the uppermost surface of the display panel DP provided by the continuous process is sufficient therefor. On the other hand, the input sensing unit TS being directly disposed on the base surface provided via the display panel DP results in the omission of a separate base substrate of the input sensing unit TS, and thus, the thickness of the display module DM is decreased.

The input sensing unit TS may have a multi-layer structure. The input sensing unit TS may include a conductive layer of a single layer or multiple layers. The input sensing unit TS may include at least one insulation layer.

The input sensing unit TS may sense an external input, for example, in a capacitive manner. An operation manner of the input sensing unit TS is not limited thereto or thereby, and the input sensing unit TS in some exemplary embodiments may sense an external input in a electromagnetic inductive manner, a pressure sensing manner, etc.

Figure 3:
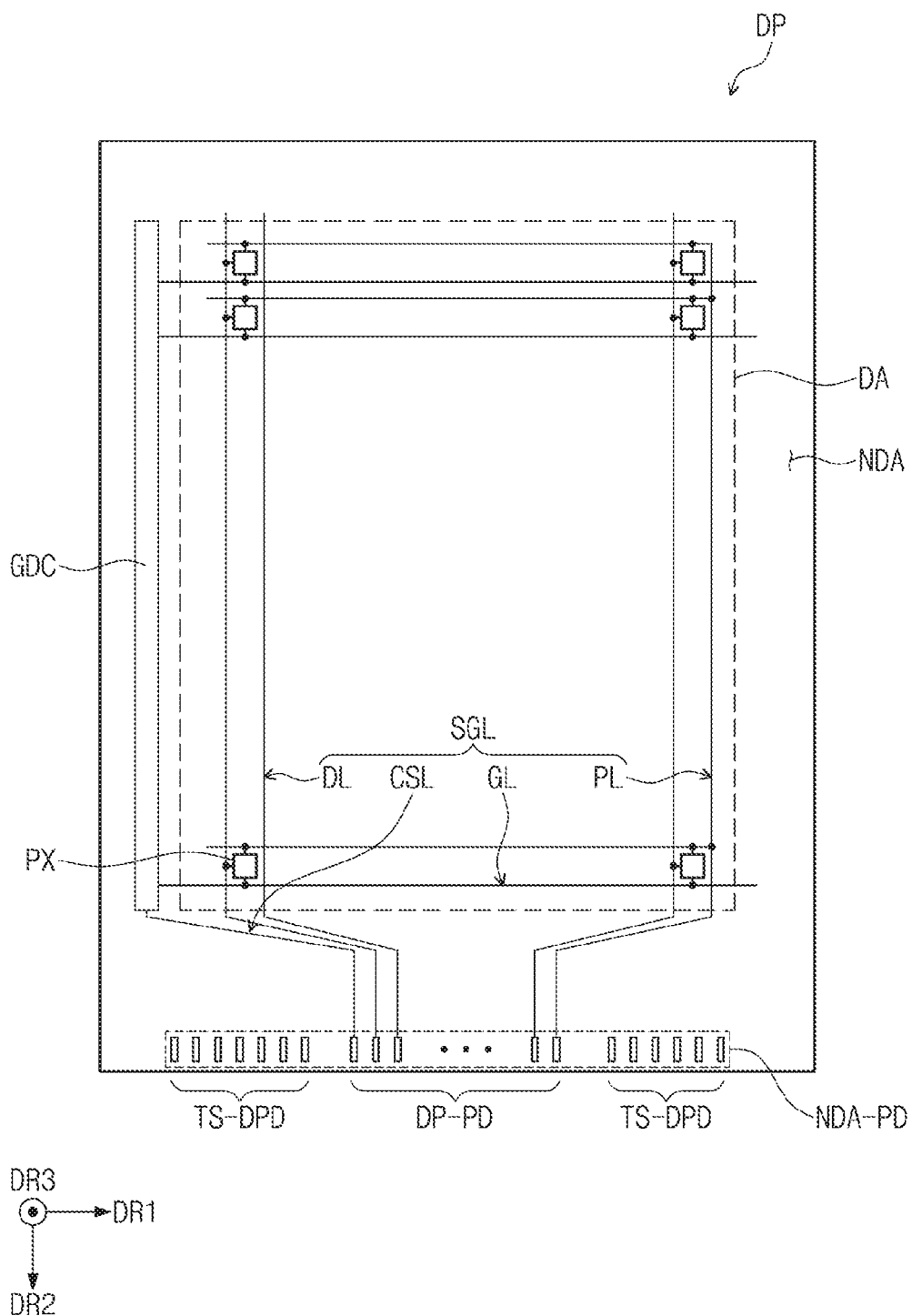
FIG. 3 is a plan view of a display panel according to some exemplary embodiments.
Figure 4:
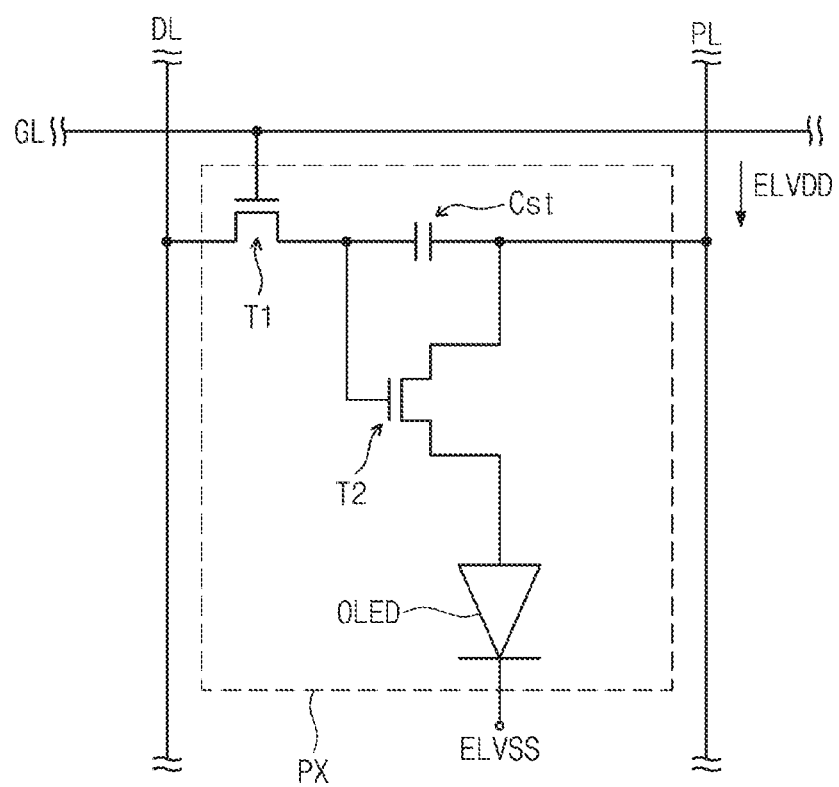
FIG. 4 is an equivalent circuit diagram of a pixel according to some exemplary embodiments.
Figure 5:
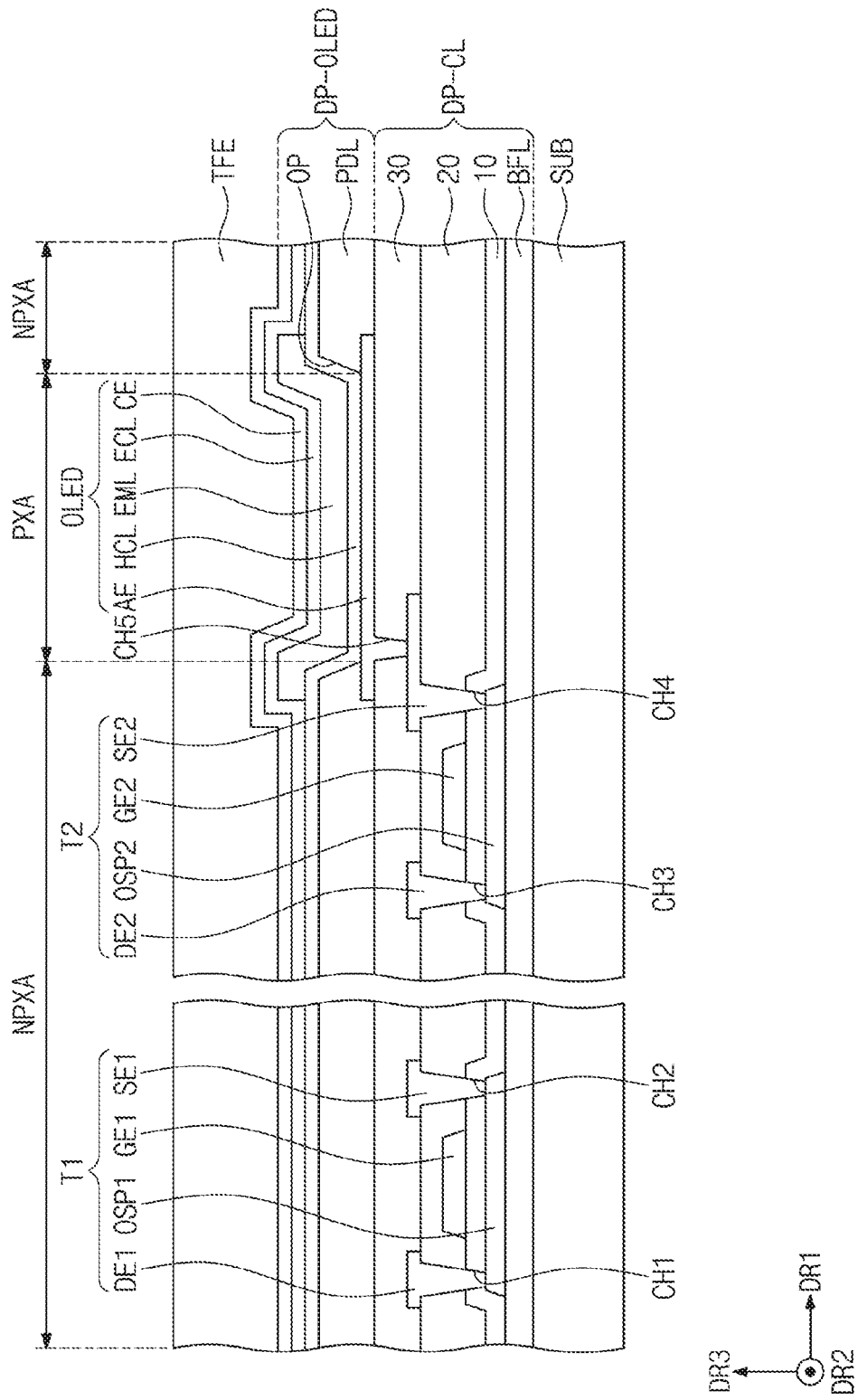
FIG. 5 is an enlarged cross-sectional view of the display panel of FIG. 1 according to some exemplary embodiments.

FIG. 3 is a plan view of a display panel according to some exemplary embodiments. FIG. 4 is an equivalent circuit diagram of a pixel according to some exemplary embodiments. FIG. 5 is an enlarged cross-sectional view of the display panel of FIG. 1 according to some exemplary embodiments.

As illustrated in FIG. 3, the display panel DP includes the display area DA and the non-display area NDA on a plane. The non-display area NDA in some exemplary embodiments may be defined according to an edge of the display area DA. The display area DA and the non-display area NDA of the display panel DP may respectively correspond to the display area DM-DA and the non-display area DM-NDA of the display module DM illustrated in FIGS. 1A to 1C. The display area DA and the non-display area NDA of the display panel DP may not be necessarily identical to the display area DM-DA and the non-display area DM-NDA of the display module DM, and may be changed according to the structure and/or design of the display panel DP.

The display panel DP may include a driving circuit GDC, a plurality of signal lines SGL, and a plurality of pixels PX. The plurality of pixels PX are disposed in the display area DA. Each of the pixels PX includes an inorganic light emitting diode and a pixel driving circuit connected thereto. The driving circuit GDC, the plurality of signal lines SGL, and the pixel driving circuit may be included in the circuit element layer DP-CL illustrated in FIG. 2.

The driving circuit GDC may include a gate driving circuit, and, as such, these terms may be interchangeably utilized herein. The gate driving circuit GDC generates a plurality of gate signals and sequentially outputs the plurality of gate signals to the plurality of gate lines GL to be described later. The gate driving circuit GDC may further output another control signal to the driving circuit of the pixels PX.

The gate driving circuit GDC may include a plurality of thin-film transistors provided through the same process as that of the driving circuit of the pixels PX, for example, a low temperature polycrystalline silicon (LTPS) process or a low temperature polycrystalline oxide (LTPO) process.

The plurality of signal lines SGL may include the gate lines GL, data lines DL, a power supply line PL, and a control signal line CSL. The gate lines GL are respectively connected to corresponding pixels PX from among the plurality of pixels PX and the data lines DL may be respectively connected to corresponding pixels PX from among the plurality of pixels PX. The power supply line PL is connected to the plurality of pixels PX. The control signal line CSL may provide control signals to the gate driving circuit GDC.

The display panel DP includes signal pads DP-PD connected to terminals of the signal lines SGL. The signal pads DP-PD may be a kind of circuit elements. An area in which the signal pads DP-PD are disposed in the non-display area NDA is defined as a pad area NDA-PD. In the pad area NDA-PD, dummy pads TS-DPD to be connected to signal lines SL1-1 to SL1-5 and SL2-1 to SL2-4 to be described later may be further disposed. The signal pads DP-PD and the dummy pads TS-DPD may be disposed on an identical layer through the same process as that of the gate lines GL (see FIG. 5) or data lines DL (see FIG. 5) to be described later.

In FIG. 4, the pixel PX connected to any one gate line GL, any one data line DL, and the power supply line PL are exemplarily illustrated. The configuration of the pixel PX is not limited thereto ore thereby, but may be modified in any suitable manner.

The organic light emitting diode OLED may be a front surface type light emitting diode (LED) or a rear surface type LED. The pixel PX includes a first transistor T1 (or a switching transistor), a second transistor T2 (or a driving transistor), and a capacitor Cst, as a pixel driving circuit for driving the organic light emitting diode OLED. A first power supply voltage ELVDD is provided to the second transistor T2, and a second power supply voltage ELVSS is provided to the organic light emitting diode OLED. The second power supply voltage ELVSS may be lower than the first power supply voltage ELVDD.

The first transistor T1 outputs a data signal applied to the data line DL in response to the gate signal applied to the gate line GL. The capacitor Cst charges a voltage corresponding to the data signal received from the first transistor T1. The second transistor T2 is connected to the organic light emitting diode OLED. The second transistor T2 controls a driving current flowing through the organic light emitting diode OLED in response to a charge amount stored in the capacitor Cst.

FIG. 5 illustrates a partial cross-section of the display panel DP corresponding to the equivalent circuit illustrated in FIG. 4. The circuit element layer DP-CL, the display element layer DP-OLED, and the thin film encapsulation layer TFE are sequentially disposed on the base layer SUB.

The circuit element layer DP-CL includes at least one inorganic layer, at least one organic layer, and a circuit element. The circuit element layer DP-CL includes a buffer layer BFL that is an inorganic layer, a first intermediate inorganic layer 10, and a second intermediate inorganic layer 20, and may further include an intermediate organic layer 30 that is an organic layer.

The inorganic layers may include silicon nitride, silicon oxy-nitride and silicon oxide, etc. The organic layer may include at least one of an acrylic based resin, a meta-acrylic based resin, polyisoprene, a vinyl based resin, an epoxy based resin, an urethane based resin, a cellulose based resin, a siloxane based resin, a polyimide based resin, a polyamide resin, or a parylene based resin. The circuit element includes conduction patterns and/or semiconductor patterns.

The buffer layer BFL enhances a binding force between the base layer SUB and the conductive patterns or the semiconductor patterns. Although not illustrated separately, a barrier layer preventing a foreign material from flowing in may be further disposed on the top surface of the base layer SUB. The buffer layer BFL and the barrier layer may be selectively disposed or omitted.

A semiconductor pattern OSP1 (hereinafter, a first semiconductor pattern) of the first transistor T1 and a semiconductor pattern T2 OSP2 (hereinafter, a second semiconductor pattern) of the second transistor T2 are disposed on the buffer layer BFL. The first semiconductor pattern OSP1 and the second semiconductor pattern OSP2 may be selected from among amorphous silicon, polycrystalline silicon, and metal oxide semiconductor.

The first intermediate inorganic layer 10 is disposed on the first semiconductor pattern OSP1 and the second semiconductor inorganic layer OSP2. A control electrode GE1 (hereinafter, a first control electrode) of the first transistor T1 and a control electrode GE2 (hereinafter, a second control electrode) of the second transistor T2 are disposed on the first intermediate inorganic layer 10. The first control electrode GE1 and the second control electrode GE2 may be manufactured according to the same photolithography process as that of the gate lines GL (see FIG. 5A).

The second intermediate inorganic layer 20 covering the first control electrode GE1 and the second control electrode GE2 is disposed on the first intermediate inorganic layer 10. An input electrode DE1 (hereinafter, a first input electrode) of the first transistor T1 and an input electrode DE2 (hereinafter, a second input electrode) of the second transistor T2 are disposed on the second intermediate inorganic layer 20.

The first input electrode DE1 and a first output electrode SE1 are connected to the first semiconductor pattern OSP1 respectively through a first through hole CH1 and a second through hole CH2 respectively penetrating through the first intermediate inorganic layer 10 and the second intermediate inorganic layer 20. The second input electrode DE2 and a second output electrode SE2 are connected to the second semiconductor pattern OSP2 respectively through a third through hole CH3 and a fourth through hole CH4 respectively penetrating through the first intermediate inorganic layer 10 and the second intermediate inorganic layer 20. On the other hand, in some exemplary embodiments, a part of the first transistor T1 and the second transistor T2 may be modified as a bottom-gate structure, a dual-gate structure, etc.

The intermediate organic layer 30 covering the first input electrode DE1, the second input electrode DE2, the first output electrode SE1, and the second output electrode SE2 is disposed on the second intermediate inorganic layer 20. The intermediate organic layer 30 may provide a flat plane.

The display element layer DP-OLED is disposed on the intermediate organic layer 30. The display element layer DP-OLED may include the pixel definition layer PDL and the organic light emitting diode OLED. The pixel definition layer PDL may include an organic material, like the intermediate organic layer 30. A first electrode AE is disposed on the intermediate organic layer 30. The first electrode AE is connected to the second output electrode SE2 through a fifth through hole CH5 penetrating through the intermediate organic layer 30. An opening OP is defined in the pixel definition layer PDL. The opening OP of the pixel definition layer PDL exposes at least a part of the first electrode AE.

The pixel PX may be disposed on a pixel area on the plane. The pixel area may include the light emitting area PXA and a non-light emitting area NPXA adjacent to the light emitting area PXA. The non-light emitting area NPXA may surround the light emitting area PXA. In some exemplary embodiments, the light emitting area PXA is defined to correspond to a partial area of the first electrode AE exposed by the opening OP.

A hole control layer HCL may be commonly disposed on the light emitting area PXA and the non-light emitting area NPXA. Although not illustrated separately, a common layer, such as the hole control layer HCL, may be commonly disposed on the plurality of pixels PX (see FIG. 3).

An emission material layer EML is disposed on the hole control layer HCL. The emission material layer EML may be disposed on an area corresponding to the opening OP. In other words, the emission material layer EML may be separately disposed on each of the plurality of pixels PX. The emission material layer EML may include an organic material and/or an inorganic material. In some exemplary embodiments, a patterned emission material layer EML is exemplarily illustrated, but the emission material layer EML may be commonly disposed on the plurality of pixels PX. The emission material layer EML may generate white light, however, exemplary embodiments are not limited thereto or thereby. In addition, the emission material layer EML may have a multilayer structure.

An electron control layer ECL is disposed on the emission material layer EML. Although not illustrated separately, the electron control layer ECL may be commonly disposed on the plurality of pixels PX (see FIG. 3).

A second electrode CE is disposed on the electron control layer ECL. The second electrode CE is commonly disposed on the plurality of pixels PX.

The thin film encapsulation layer TFE is disposed on the second electrode CE. The thin film encapsulation layer TFE is commonly disposed on the plurality of pixels PX. In some exemplary embodiments, the thin film encapsulation layer TFE directly covers the second electrode CE. In some exemplary embodiments, a capping layer covering the second electrode CE may be further disposed between the thin film encapsulation layer TFE and the second electrode CE. The thin film encapsulation layer TFE may directly cover the capping layer.

Figure 6A:
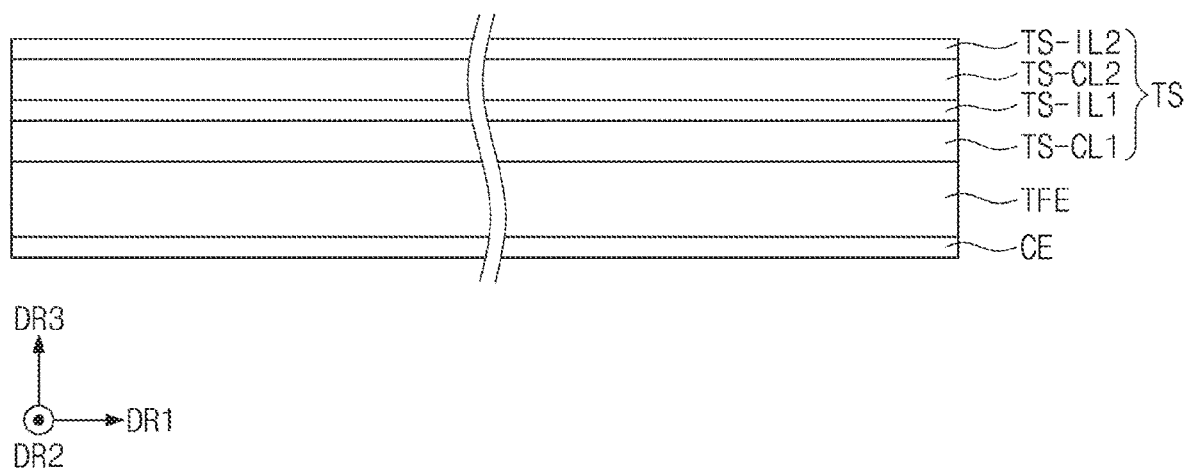
FIG. 6A is a cross-sectional view of an input sensing unit according to some exemplary embodiments.
Figure 6B:
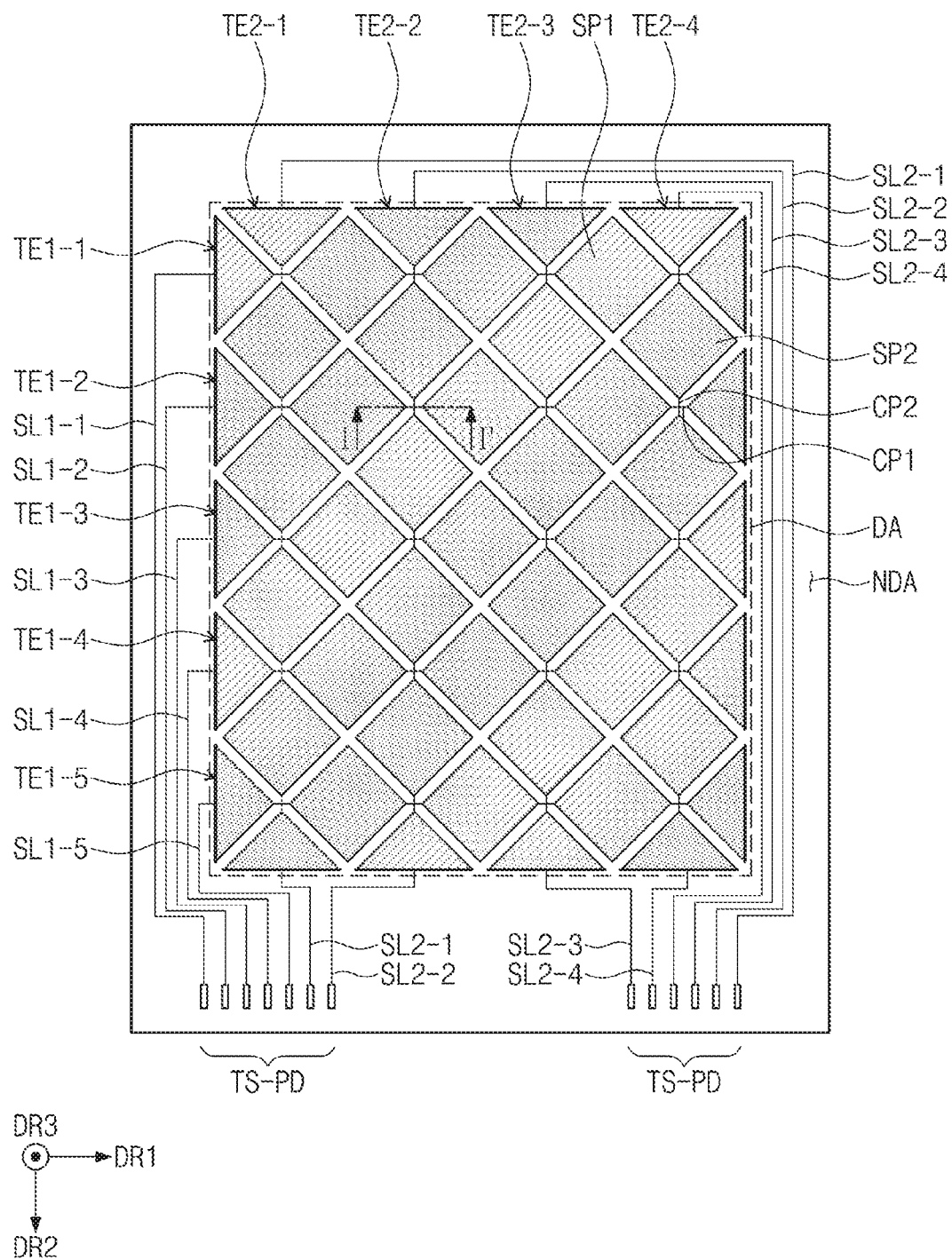
FIG. 6B is a plan view of the input sensing unit of FIG. 6A according to some exemplary embodiments.
Figure 7A:
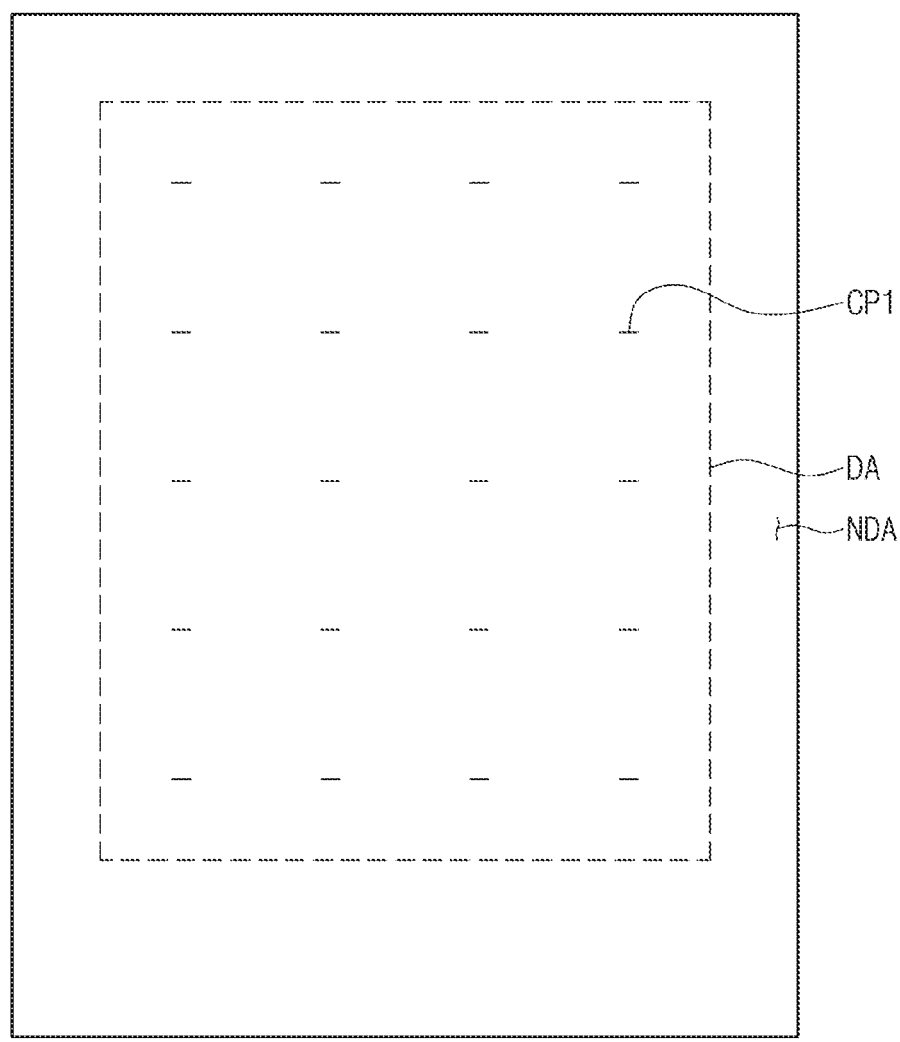
FIG. 7A is a plan view of a first conductive layer of the input sensing unit of FIG. 6A according to some exemplary embodiments.
Figure 7A:
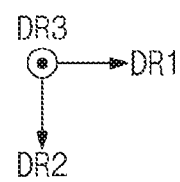
Figure 7B:
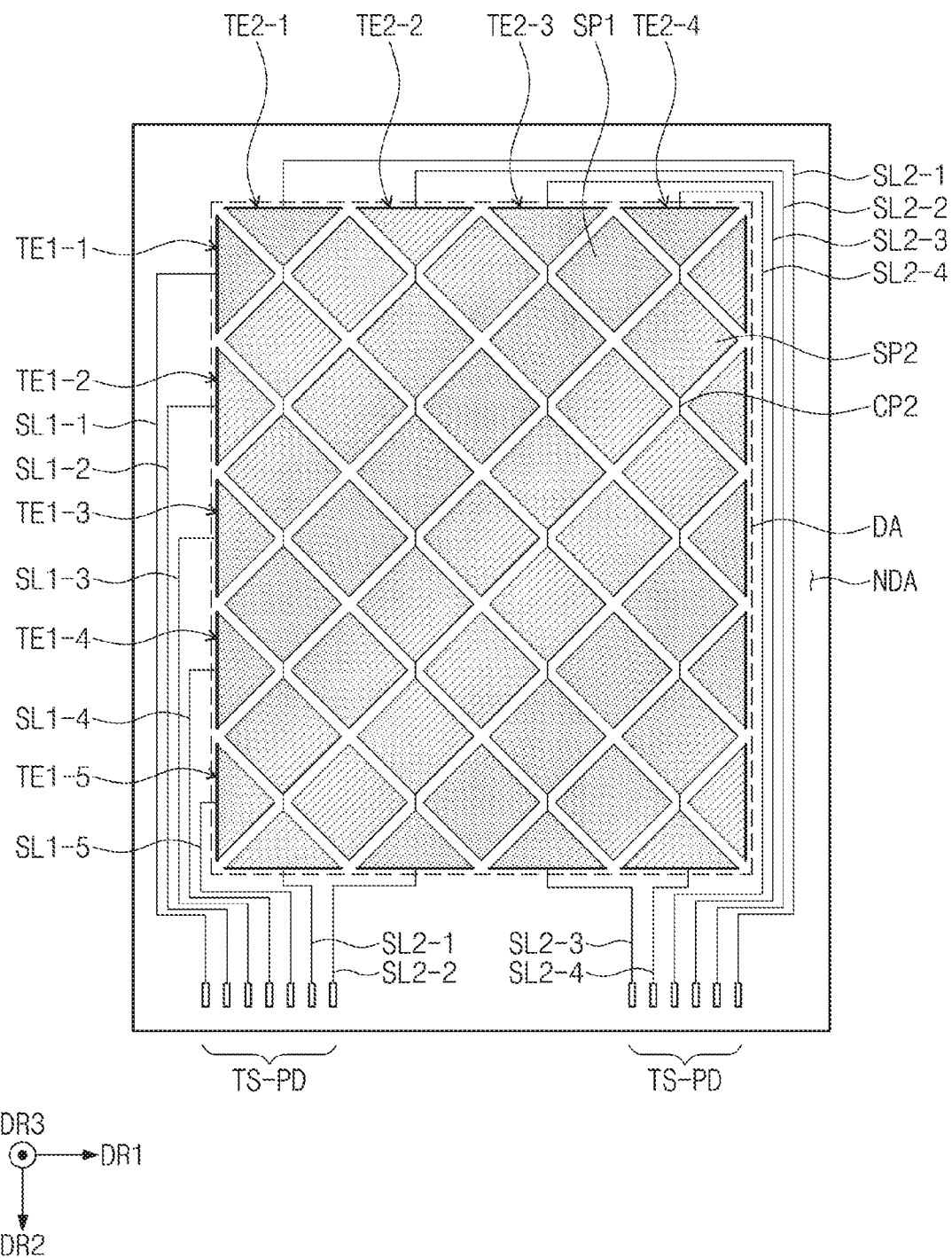
FIG. 7B is a plan view of a second conductive layer of the input sensing unit of FIG. 6A according to some exemplary embodiments.
Figure 7C:
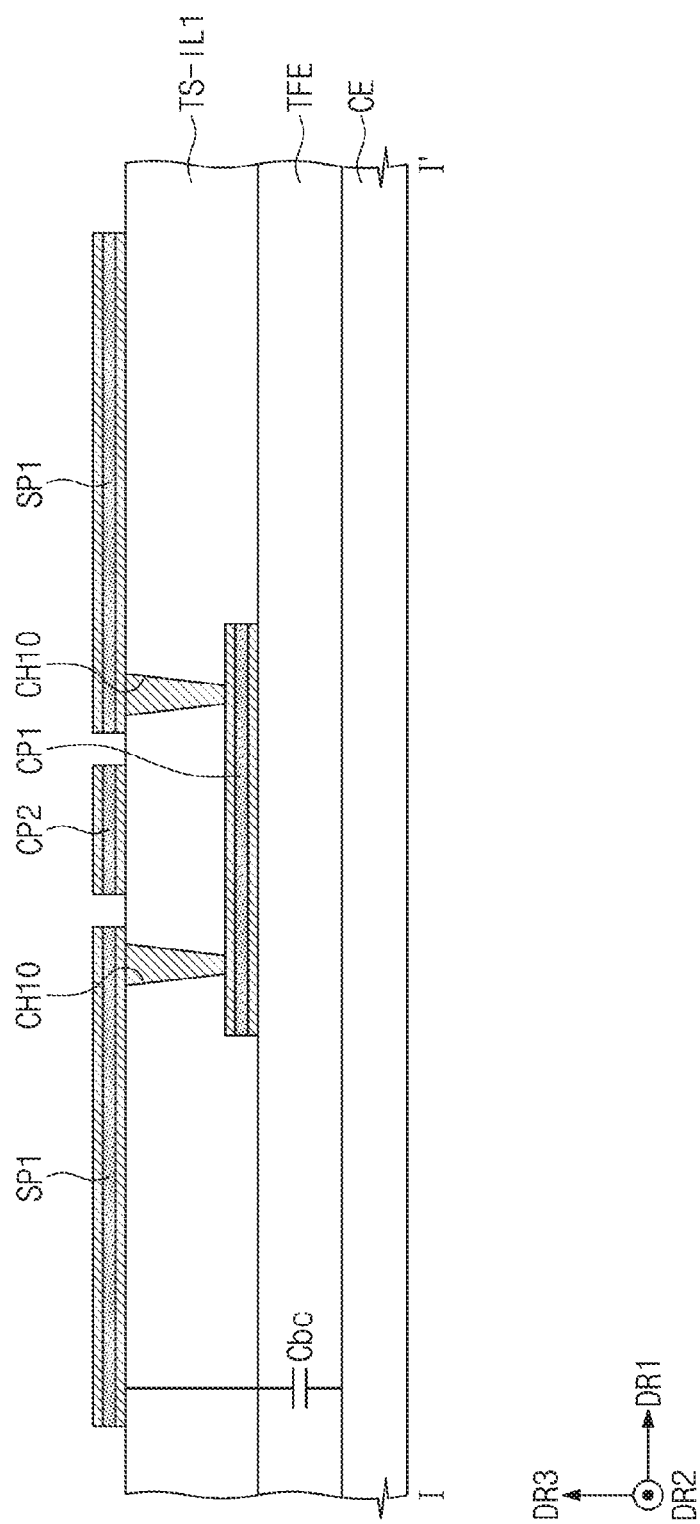
FIG. 7C is a partial cross-sectional view of the input sensing unit of FIG. 6B taken along sectional line I-I' according to some exemplary embodiments.

FIG. 6A is a cross-sectional view of an input sensing unit according to some exemplary embodiments. FIG. 6B is a plan view of the input sensing unit of FIG. 6A according to some exemplary embodiments. FIG. 7A is a plan view of a first conductive layer of the input sensing unit of FIG. 6A according to some exemplary embodiments. FIG. 7B is a plan view of a second conductive layer of the input sensing unit of FIG. 6A according to some exemplary embodiments. FIG. 7C is a partial cross-sectional view of the input sensing unit of FIG. 6B taken along sectional line I-I' according to some exemplary embodiments. In FIG. 6A, as a configuration of the display panel DP (see FIG. 5), the second electrode CE and the thin film encapsulation layer TFE are illustrated.

As illustrated in FIG. 6A, the input sensing unit TS includes a first conductive layer TS-CL1, a first insulation layer TS-IL1, a second conductive layer TS-CL2, and a second insulation layer TS-IL2. In some exemplary embodiments, the first conductive layer TS-CL1 is directly disposed on the thin film encapsulation layer TFE, but exemplary embodiments are not limited thereto or thereby. For instance, another inorganic layer or organic layer may be further disposed between the first conductive layer TS-CL1 and the thin film encapsulation layer TFE. In some exemplary embodiments, the second insulation layer TS-IL2 may be omitted, and an optical member or an adhesive layer, etc., may replace a protection function of the second insulation layer TS-IL2.

Each of the first conductive layer TS-CL1 and the second conductive layer TS-CL2 may have a single layer structure or a multilayer structure along the third directional axis DR3. A conductive layer of a single layer structure may include a metal layer or a transparent conductive layer. The metal layer may include, for instance, at least one of molybdenum, silver, titanium, copper, aluminum, and an alloy thereof. The transparent conductive layer may include, for example, at least one of a transparent conductive oxide, such as indium tin oxide (ITO), indium zinc oxide (IZO), zinc oxide (ZnO), or indium tin zinc oxide (ITZO). In some exemplary embodiments, the transparent conductive layer may include at least one of a conductive polymer, e.g., poly(3,4-ethylenedioxythiophene) (PEDOT), etc., a metal nano-wire, and graphene. A conductive layer of a multilayer structure may include a multi-layered metal layer. For example, the multi-layered metal layer may have a three-layered structure of titanium/aluminum/titanium. A conductive layer of a multilayer structure may include a single metal layer and a transparent conductive layer. A conductive layer of a multilayer structure may include a multi-layered metal layer and a transparent conductive layer.

As will become more apparent below, each of the first conductive layer TS-CL1 and the second conductive layer TS-CP2 includes a plurality of conductive patterns. The conductive patterns may include electrodes and signal lines.

Each of the first insulation layer TS-IL1 and the second insulation layer TS-IL2 may include an inorganic material or an organic material. At least one of the first insulation layer TS-IL1 and the second insulation layer TS-IL2 may include an inorganic layer. The inorganic layer may include at least one of aluminum oxide, titanium oxide, silicon oxide, silicon oxynitride, zirconium oxide, and hafnium oxide. At least one of the first insulation layer TS-IL1 and the second insulation layer TS-IL2 may include an organic layer. The organic layer may include at least one of an acrylic based resin, a meta-acrylic based resin, polyisoprene, a vinyl based resin, an epoxy based resin, an urethane based resin, a cellulose based resin, a siloxane based resin, a polyimide based resin, a polyamide resin, and a parylene based resin.

As illustrated in FIG. 6B, the input sensing unit TS may include first electrodes TE1-1 to TE1-5, first signal lines SL1-1 to SL1-5 connected to the first electrodes TE1-1 to TE1-5, second electrodes TE2-1 to TE2-4, second signal lines SL2-1 to SL2-4 connected to the second electrodes TE2-1 to TE2-5, and touch pads TS-PD connected to the first signal lines SL1-1 to SL1-5 and the second signal lines SL2-1 to SL2-4. Directions of extension of the first electrodes TE1-1 to TE1-5 and the second electrodes TE2-1 to TE2-4 intersect with each other, but the first electrodes TE1-1 to TE1-5 and the second electrodes TE2-1 to TE2-4 are insulated from one another. The first electrodes TE1-1 to TE1-5 are arrayed in the second direction DE2, each of which has a shape extending toward the first direction DR1. The second electrodes TE2-1 to TE2-5 are arrayed in the first direction DR1, each of which has a shape extending toward the second direction DR2. Although particular numbers of the first electrodes TE1-1 to TE1-5, the first signal lines SL1-1 to SL1-5, the second electrodes TE2-1 to TE2-4, the second signal lines SL2-1 to SL2-4, and the touch pads TS-PD are shown, exemplary embodiments are not limited thereto or thereby. In this manner, any suitable number of the first electrodes TE1-1 to TE1-5, the first signal lines SL1-1 to SL1-5, the second electrodes TE2-1 to TE2-4, the second signal lines SL2-1 to SL2-4, and the touch pads TS-PD may be utilized.

Each of the first electrodes TE1-1 to TE1-5 has a first length and each of the second electrodes TE2-1 to TE2-4 has a second length. The first length extends toward the first direction DR1, the second length extends toward the second direction DR2. In some exemplary embodiments, the second length is longer than the first length. As will be described later in relation with FIGS. 7A to 7C, since the second electrodes TE2-1 to TE2-4 have more sensors than the first electrodes TE1-1 to TE1-5, the second electrodes TE2-1 to TE2-4 have a longer length than the first electrodes TE1-1 to TE1-5.

The first signal lines SL1-1 to SL1-5 are respectively connected to one (e.g., first) ends of the first electrodes TE1-1 to TE1-5. The second signal lines SL2-1 to SL2-4 are respectively connected to both (e.g., first and second) ends of the second electrodes TE2-1 to TE2-4. In some exemplary embodiments, the first signal lines SL1-1 to SL1-5 may also be respectively connected to both ends of the first electrodes TE1-1 to TE1-5. In some exemplary embodiments, the second signal lines SL2-1 to SL2-4 may be respectively connected to only one ends of the second electrodes TE2-1 to TE2-4.

In some exemplary embodiments, the first signal lines SL1-1 to SL1-5, the second signal lines SL2-1 to SL2-4, and the touch pads TS-PD may be replaced by a circuit board, etc., that is separately manufactured and coupled as part of the display module DM. In some exemplary embodiments, the touch pads TS-PD may be omitted, and the first signal lines SL1-1 to SL1-5 and the second signal lines SL2-1 to SL2-4 may be connected to the dummy pads TS-DPD illustrated in FIG. 3.

According to various exemplary embodiments, the input sensing unit TS may sense an external input in a mutual capacitive-type or a self-capacitive type. Although not illustrated in FIG. 6B, the input sensing unit TS includes at least one insulation layer.

As illustrated in FIG. 6B, each of the first electrodes TE1-1 to TE1-5 includes first sensing parts SP1 and first connecting parts CP1. Each of the second electrodes TE2-1 to TE2-4 includes second sensing parts SP2 and second connecting parts CP2. The first sensing parts SP1 are arrayed along the first direction DR1 and the second sensing parts SP2 are arrayed along the second direction DR2. Each of the first connecting parts CP1 connects adjacent sensing parts SP1 and each of the second connecting parts CP2 connects adjacent second sensing parts SP2.

The second electrodes TE2-1 to TE2-4, which are longer than the first electrodes TE1-1 to TE1-5, include a larger number of sensing parts and connecting parts. Accordingly, the second electrodes TE2-1 to TE2-4 may have larger outlined areas than the first electrodes TE1-1 to TE1-5. Herein, the "outlined area" is an area defined by an outline of an associated electrode, as will become more apparent below. In some exemplary embodiments, the outlined areas of the first sensing part SP1 and the second sensing part SP2 may be identical. Accordingly, the outlined areas of the first electrodes TE1-1 to TE1-5 and the second electrodes TE2-1 to TE2-4 may be respectively proportional to the respective numbers of included sensing parts.

FIG. 6B exemplarily illustrates the first electrodes TE1-1 to TE1-5 including five first sensing parts SP1 and the second electrodes TE2-1 to TE2-4 including six second sensing parts SP2. Two first sensing parts SP1 (hereinafter, first half sensing parts) disposed on both ends of the five first sensing parts SP1 may have a size of half the first sensing parts disposed in the central region. Two second sensing part SP2 (hereinafter, second half sensing parts) disposed on both ends of the six second sensing part SP2 may have a size of half the second sensing parts disposed in the central region. In some exemplary embodiments, the two first half sensing parts and the two second half sensing parts are treated as one sensing part in calculating (or otherwise determining) outlined areas, opening areas, and effective areas that will be described later in more detail.

As illustrated in FIGS. 7A to 7C, the first connecting parts CP1 are disposed on the thin film encapsulation layer TFE, e.g., between the first insulation layer TS-IL1 and the thin film encapsulation layer TFE. The first connecting parts CP1 may include a transparent conductive oxide and/or a metal. In some exemplary embodiments, the first connecting parts CP1 may include a multi-layered metal layer. In some exemplary embodiments, instead of the first connecting parts CP1, the second connecting parts CP2 may be disposed on the thin film encapsulation layer TFE, e.g., between the first insulation layer TS-IL1 and the thin film encapsulation layer TFE.

The first insulation layer TS-IL1 covering the first connecting parts CP1 is disposed on the thin film encapsulation layer TFE. Contact holes CH10 exposing portions of the first connecting parts CP1 are defined in the first insulation layer TS-IL1.

The first sensing parts SP1 and the second sensing parts SP2 are disposed on the first insulation layer TS-IL1. In addition, the second connecting parts CP2 are disposed on the first insulation layer TS-IL1. The second sensing parts SP2 and the second connecting parts CP2 may be provided through an identical photolithography process, and, thereby, may have an integrated shape. For instance, the second connecting parts CP2 may extend from the second sensing parts SP2.

The first sensing parts SP1, the second sensing parts SP2, and the second connecting parts CP2 may include a transparent conductive oxide and/or a metal. In some exemplary embodiments, the first sensing parts SP1, the second sensing parts SP2, and the second connecting parts CP2 may include a multi-layered metal layer, for example, a titanium/aluminum/titanium metal layer.

The first signal lines SL1-1 to SL1-5 and the second signal lines SL2-1 to SL2-4 are disposed on the first insulation layer TS-IL1. The first signal lines SL1-1 to SL1-5 and the second signal lines SL2-1 to SL2-4 may be provided through the same process as that of the first sensing parts SP1, and, thereby, may have an identical laminated structure.

In some exemplary embodiments, the second conductive layer TS-CL2 includes the first sensing parts SP1 and the second sensing parts SP2 to maintain a greater distance (e.g., spacing in the third directional axis DR3) from the second electrode CE of the display panel DP. Compared to a input sensing unit in which the first conductive layer TS-CL1 includes the first sensing parts SP1 and the second sensing parts SP2, the input sensing unit TS according to various exemplary embodiments may reduce parasitic capacitance Cbc between the second electrode CE and the first sensing parts SP1 and the second sensing parts SP2.

The distance between the second electrode CE and the first sensing parts SP1 and the second sensing parts SP2 may be about 0.5 μm to about 5 μm. The sum of the thicknesses of insulation layers disposed between the second electrode CE and the first sensing parts SP1 and the second sensing parts SP2, for example, the thin film encapsulation layer TFE and the first insulation layer TS-IL1, may be about 0.5 μm to about 30 μm. To increase flexibility of the display panel DP, the thickness of an insulation layer disposed between the second electrode CE and the first sensing parts SP1 and the second sensing parts SP2 may be about 0.5 μm to about 10 μm, e.g., about 0.5 μm to about 5 μm.

As described in relation to FIGS. 1A to 1C, as the thickness of the foldable display module DM becomes thinner, cracks in internal components occurring at the time of being folded may be prevented. In some exemplary embodiments, even if the thin film encapsulation layer TFE and the first insulation layer TS-IL1 having relatively thin thicknesses as described above are applied, the second conductive layer TS-CL2 may reduce parasitic capacitance by including the first sensing parts SP1 and the second sensing parts SP2.

Exemplary embodiments, however, are not limited to or by the above-noted structure of the input sensing unit TS. For instance, components of the first conductive layer TS-CL1 and the second conductive layer TS-CL2 may be changed with respect to each other. For example, the second connecting parts CP2 may be disposed on an upper surface of the first insulation layer TS-IL1, and, furthermore, the first sensing parts SP1, the second sensing parts SP2, and the first connecting parts CP1 may be disposed on a lower surface of the first insulation layer TS-IL1.

Figure 8A:
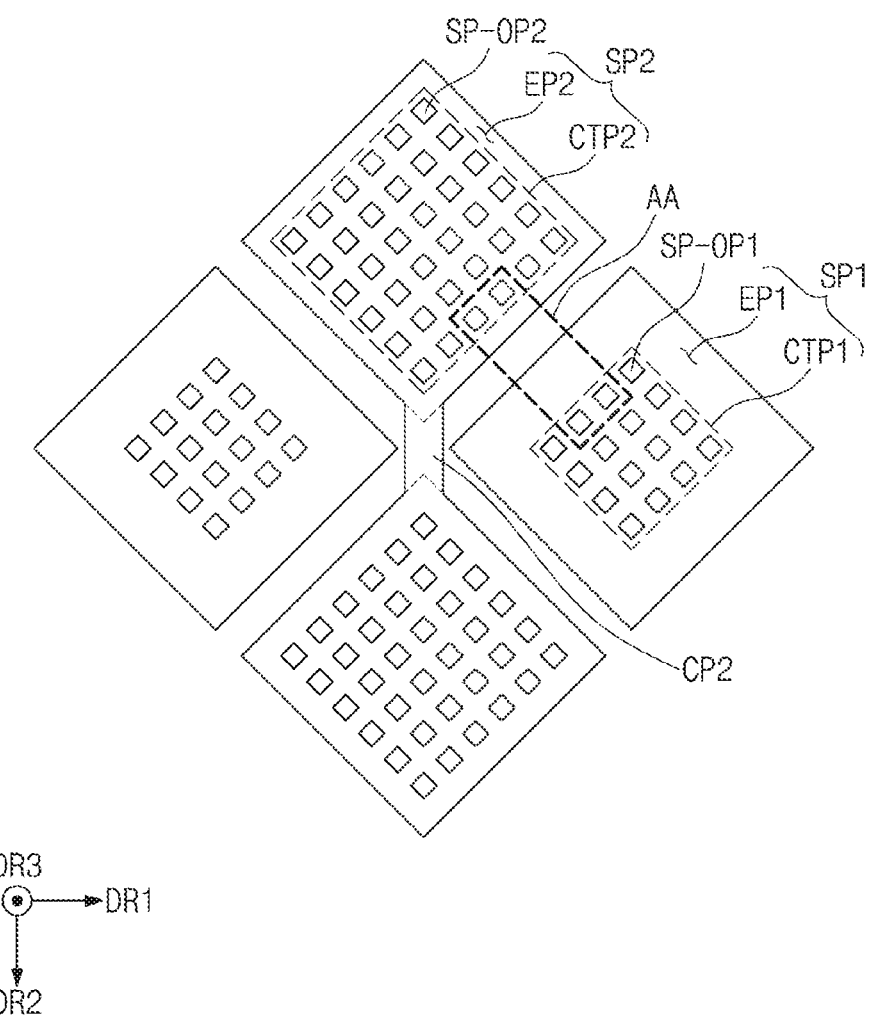
FIG. 8A is a partial plan view of the input sensing unit of FIG. 6B according to some exemplary embodiments.
Figure 8B:
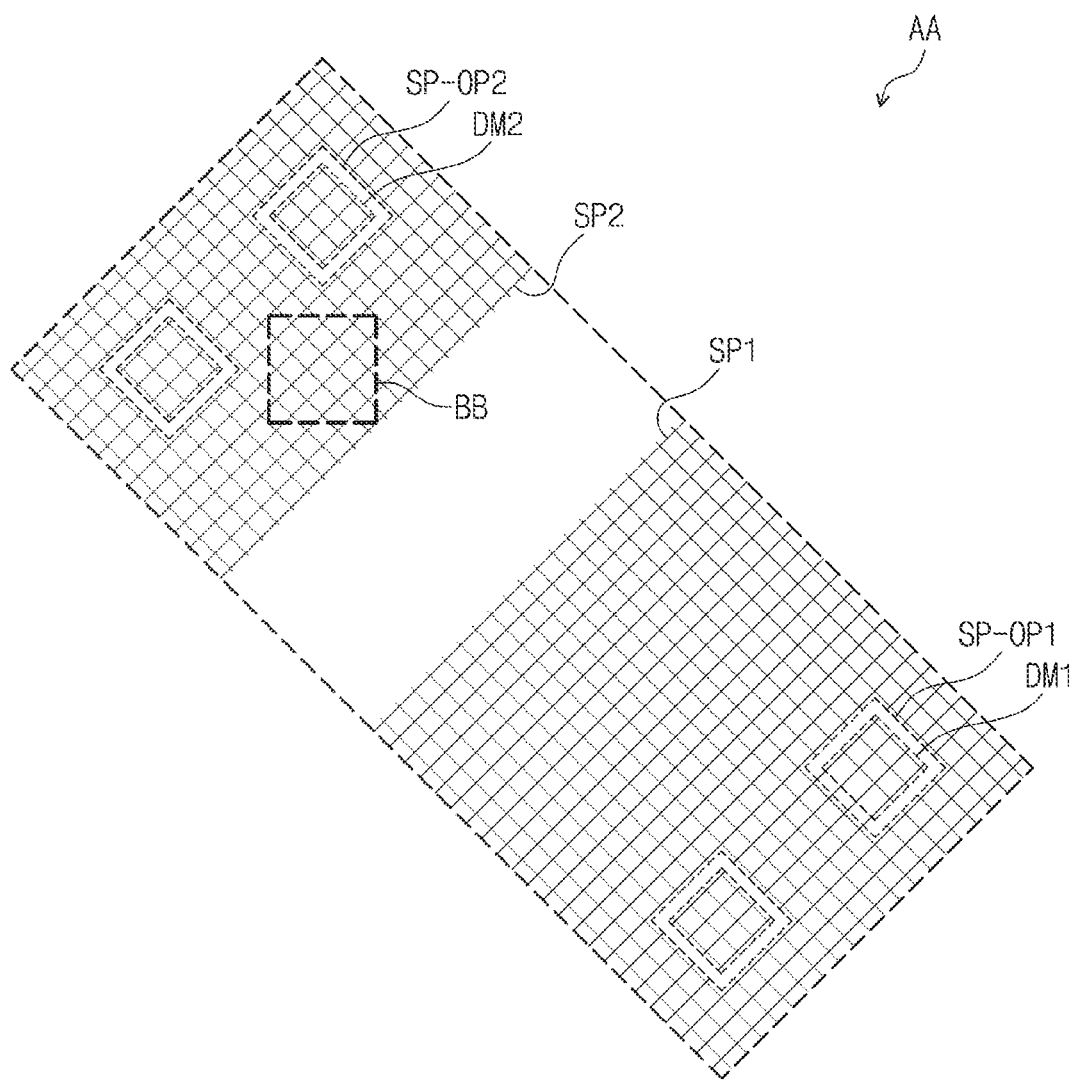
FIG. 8B is an enlarged view of a portion AA of the input sensing unit of FIG. 8A according to some exemplary embodiments.
Figure 8C:
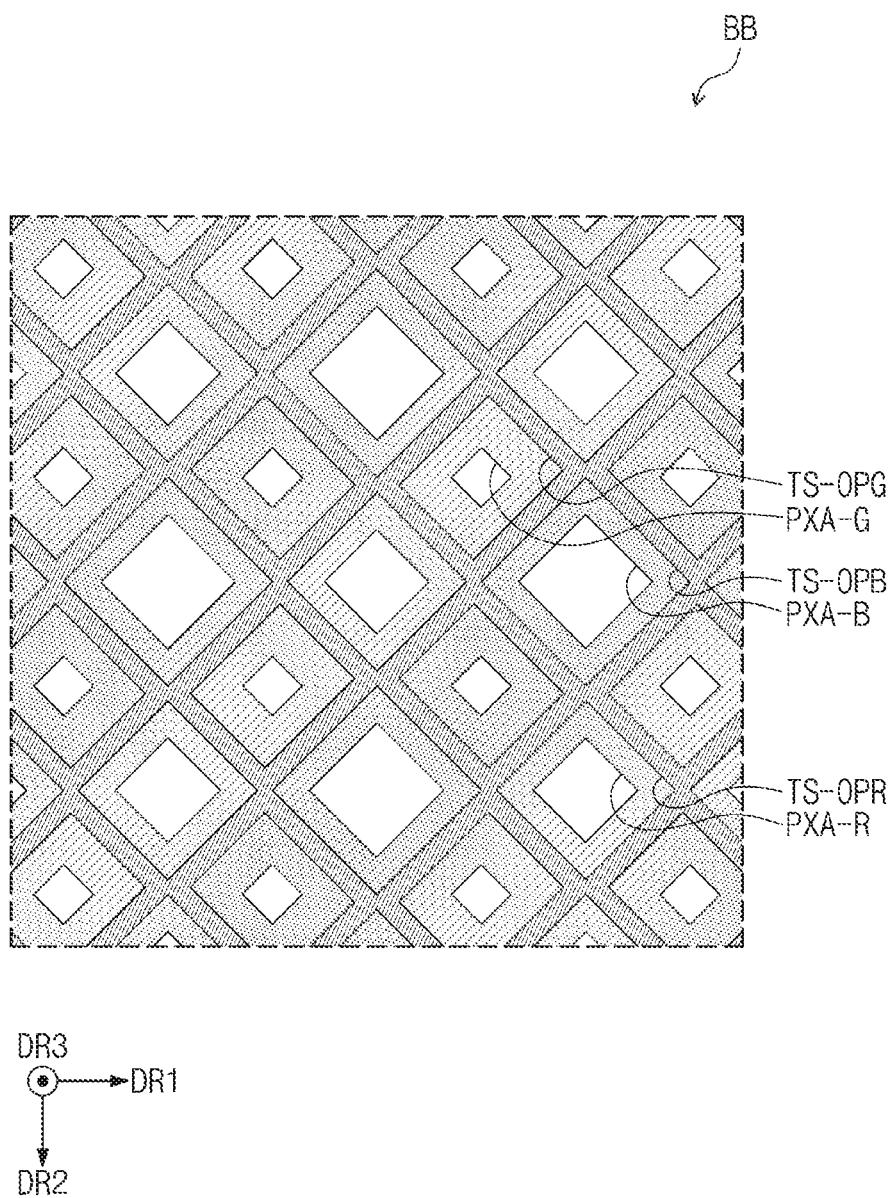
FIG. 8C is an enlarged view of a portion BB of the input sensing unit of FIG. 8B according to some exemplary embodiments.

FIG. 8A is a partial plan view of the input sensing unit of FIG. 6B according to some exemplary embodiments. FIG. 8B is an enlarged view of a portion AA of the input sensing unit of FIG. 8A according to some exemplary embodiments. FIG. 8C is an enlarged view of a portion BB of the input sensing unit of FIG. 8B according to some exemplary embodiments. In this manner, FIG. 8A illustrates an enlarged area corresponding to two first sensing parts SP1 and two second sensing parts SP2.

As illustrated in FIG. 8A, the first sensing parts SP1 include a first center part CTP1 and a first edge part EP1, the second senor units SP2 include a second center part CTP2 and the second edge part EP2. At least one first opening SP-OP1 is defined in the first center part CTP1 and at least one opening SP-OP2 is defined in the second center part CTP2. FIG. 8A exemplarily illustrates sixteen (16) first openings SP-OP1 disposed in a matrix type and thirty six (36) second openings SP-OP2 disposed in a matrix type; however, exemplary embodiments are not limited thereto or thereby. In some exemplary embodiments, the first openings SP-OP1 and the second openings SP-OP2 may be provided in an identical number. As shown, however, the first openings SP-OP1 occupy a smaller area than the second openings SP-OP2.

The definition of the openings in each of the first sensing parts SP1 and the second sensing parts SP2 may cause reduction in the parasitic capacitance Cbc between the second electrode CE and the first sensing parts SP1 and the second sensing parts SP2 described in relation to FIG. 7C, e.g., the parasitic capacitance between the second electrode CE and the first electrodes TE1-1 to TE1-5 and the second electrodes TE2-1 to TE2-4 (see FIG. 6B).

Since openings are not provided in the first edge part EP1 and the second edge part EP2 respectively adjacent to the first sensing parts SP1 and the second sensing parts SP2, a capacitance change amount value between the first sensing part SP1 and the second sensing part SP2 may be maintained equal to or greater than a reference value at least because facing areas between the first sensing parts SP1 and the second sensing parts SP2 may exert a greater influence on capacitance. As used herein, the capacitance change amount is a difference value between capacitances before and after a touch event occurs.

The first electrodes TE1-1 to TE1-5 have a first opening area due to the first openings SP-OP1 and the second electrodes TE2-1 to TE2-4 have a second opening area due to the second openings SP-OP2. The first opening area is defined as a sum of total areas of the first openings SP-OP1 and the second opening area is defined as a sum of total areas of the second openings SP-OP2.

As illustrated in FIG. 8A, since the second sensing part SP2 has more openings than the first sensing part SP1, the second opening area is greater than the first opening area. Deviations in parasitic capacitance, which are generated in the first electrodes TE1-1 to TE1-5 and the second electrodes TE2-1 to TE2-4, may be reduced by providing a greater opening area to the second electrodes TE2-1 to TE2-4 of which the outlined area is greater than that the outline area of the first electrodes TE1-1 to TE1-5.

The first electrodes TE1-1 to TE1-5 and the second electrodes TE2-1 to TE2-4 may have a mesh shape to reduce the parasitic capacitance Cbc. Hereinafter, more detailed descriptions of the first electrodes TE1-1 to TE1-5 and the second electrodes TE2-1 to TE2-4 will be provided.

As illustrated in FIGS. 8B and 8C, the first sensing part SP1 and the second sensing part SP2 may include mesh lines. Although not illustrated separately, the first connecting part CP1 and the second connecting part CP2 also may have mesh lines.

As illustrated in FIG. 8C, the second sensing part SP2 does not overlap the light emitting areas PXA-R, PXA-G, and PXA-B, but overlaps the non-light emitting areas NPXA (see FIG. 5). The light emitting areas PXA-R, PXA-G, and PXA-B may be defined as the light emitting area PXA of FIG. 5. The mesh lines of the second sensing part SP2 define a plurality of mesh holes TS-OPR, TS-OPG, and TS-OPB. The line width of the mesh lines may be several μm to several nm. The plurality of mesh holes TS-OPR, TS-OPG, and TS-OPB are defined in the second sensing part SP2. The plurality of mesh holes TS-OPR, TS-OPG, and TS-OPB may be in one-to-one correspondence with the light emitting areas PXA-R, PXA-G, and PXA-B.

The light emitting areas PXA-R, PXA-G, and PXA-B are disposed separately from each other and the non-light emitting areas NPXA are disposed therebetween. For each of the light emitting areas PXA-R, PXA-G, and PXA-B, a corresponding organic light emitting diode OLED is disposed. The light emitting areas PXA-R, PXA-G, and PXA-B may be divided into several groups according to colors of light generated by the corresponding organic light emitting diodes OLEDs. FIG. 8C illustrates the light emitting areas PXA-R, PXA-G, and PXA-B divided into three groups according to the emitted light colors of corresponding organic light emitting diodes OLEDs.

In some exemplary embodiments, the light emitting areas PXA-R, PXA-G, and PXA-B may have different areas according to light colors emitted by the emission material layer EML (see FIG. 6C) of the organic light emitting diodes OLEDs (see FIG. 5). According to types of the organic light emitting diodes OLEDs, the areas of the light emitting areas PXA-R, PXA-G, and PXA-B may be determined. For instance, the light emitting area PXA-B may be the largest, the light emitting area PXA-G may be the smallest, and the light emitting area PXA-R may be sized between the light emitting areas PXA-B and PXA-G. Exemplary embodiments, however, are not limited thereto or thereby.

The plurality of mesh holes TS-OPR, TS-OPG, and TS-OPB may be divided into several groups having different areas. The plurality of mesh holes TS-OPR, TS-OPG, and TS-OPB may be divided into three groups according to the corresponding light emitting areas PXA-R, PXA-G, and PXA-B.

As described, the plurality of mesh holes TS-OPR, TS-OPG, and TS-OPB have been described to be in one-to-one correspondence with the light emitting areas PXA-R, PXA-G, and PXA-B, but exemplary embodiments are not limited thereto or thereby. For instance, one mesh hole TS-OPR, TS-OPG, or TS-OPB may be in one-to-one correspondence with two or more light emitting areas PXA-R, PXA-G, and PXA-B.

The various areas of the light emitting areas PXA-R, PXA-G, and PXA-B are exemplarily illustrated, but exemplary embodiments are not limited thereto or thereby. For instance, the sizes of the light emitting areas PXA-R, PXA-G, and PXA-B may be identical and the sizes of the mesh holes TS-OPR, TS-OPG, and TS-OPB may also be identical.

As illustrated in FIG. 8B, first dummy electrodes DM1 may be disposed the inner side of the first openings SP-OP1 and second dummy electrodes DM2 may be disposed the inner side of the second openings SP-OP2. The first dummy electrodes DM1 may be respectively disposed on (or in) the first openings SP-OP1 and the second dummy electrodes DM2 may be respectively disposed on (or in) the second openings SP-OP2.

The first dummy electrodes DM1 and the second dummy electrodes DM2 may be floating electrodes. Accordingly, the first dummy electrodes DM1 and the second dummy electrodes DM2 do not influence the parasitic capacitance Cbc of the first electrodes TE1-1 to TE1-5 and the second electrodes TE2-1 to TE2-5. The first dummy electrodes DM1 and the second dummy electrodes DM2 are disposed on (or in) the first openings SP-OP1 and the second openings SP-OP2 to increase an external light reflectivity of the first openings SP-OP1 and the second openings SP-OP2 to a level similar to a reflectivity of another area of a corresponding one of the first electrodes TE1-1 to TE1-5 or a corresponding one of the second electrodes TE2-1 to TE2-5. As illustrated in FIG. 8B, the first dummy electrodes DM1 and the second dummy electrodes DM2 may include mesh lines. Although not illustrated, the first dummy electrodes DM1 and the second dummy electrodes DM2 may have the same characteristics (e.g., configuration) as the mesh lines of the second sensing part SP2 illustrated in FIG. 8C.

Figure 9A:
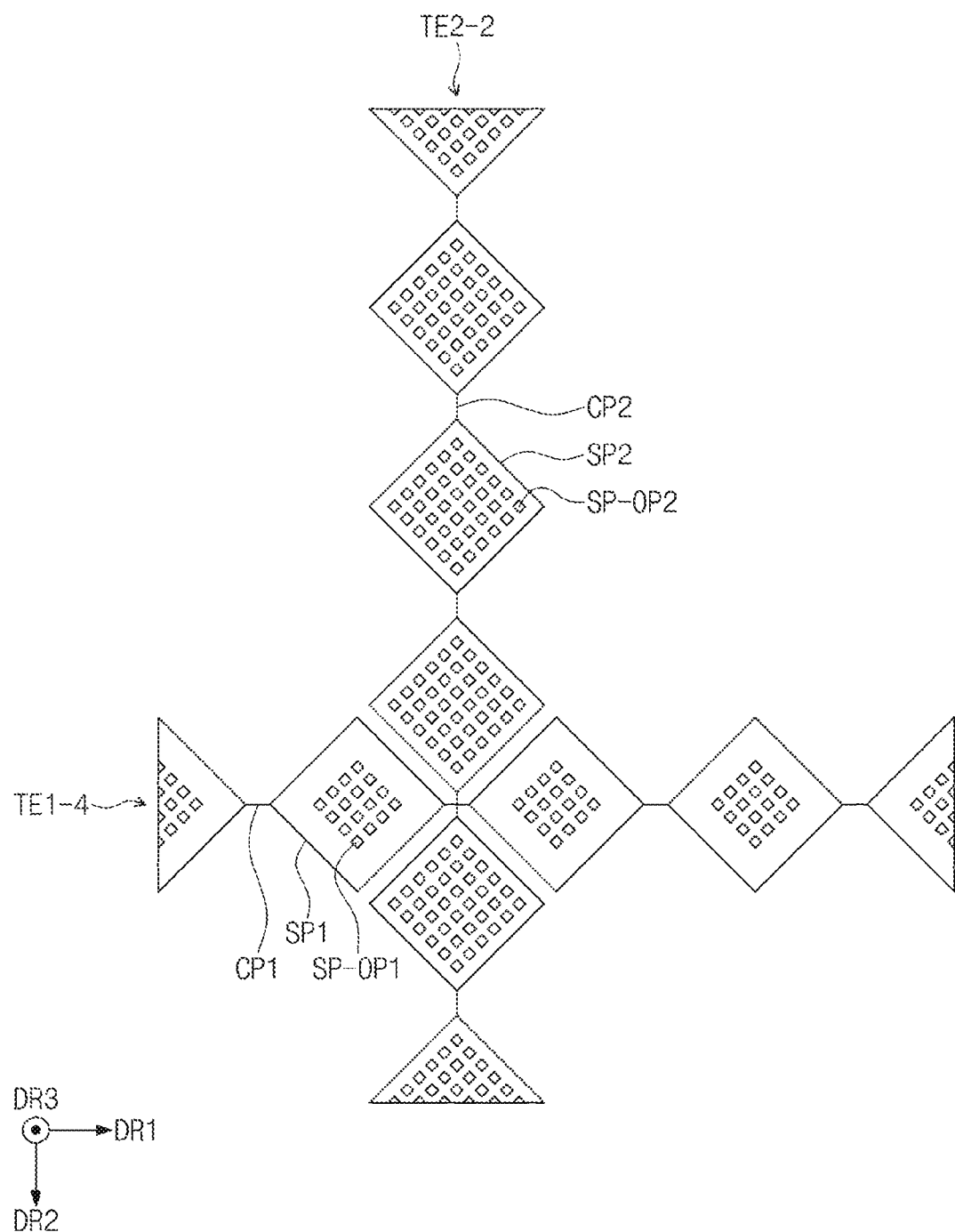
FIG. 9A is a plan view of a portion of the input sensing unit of FIG. 6B according to some exemplary embodiments.
Figure 9B:
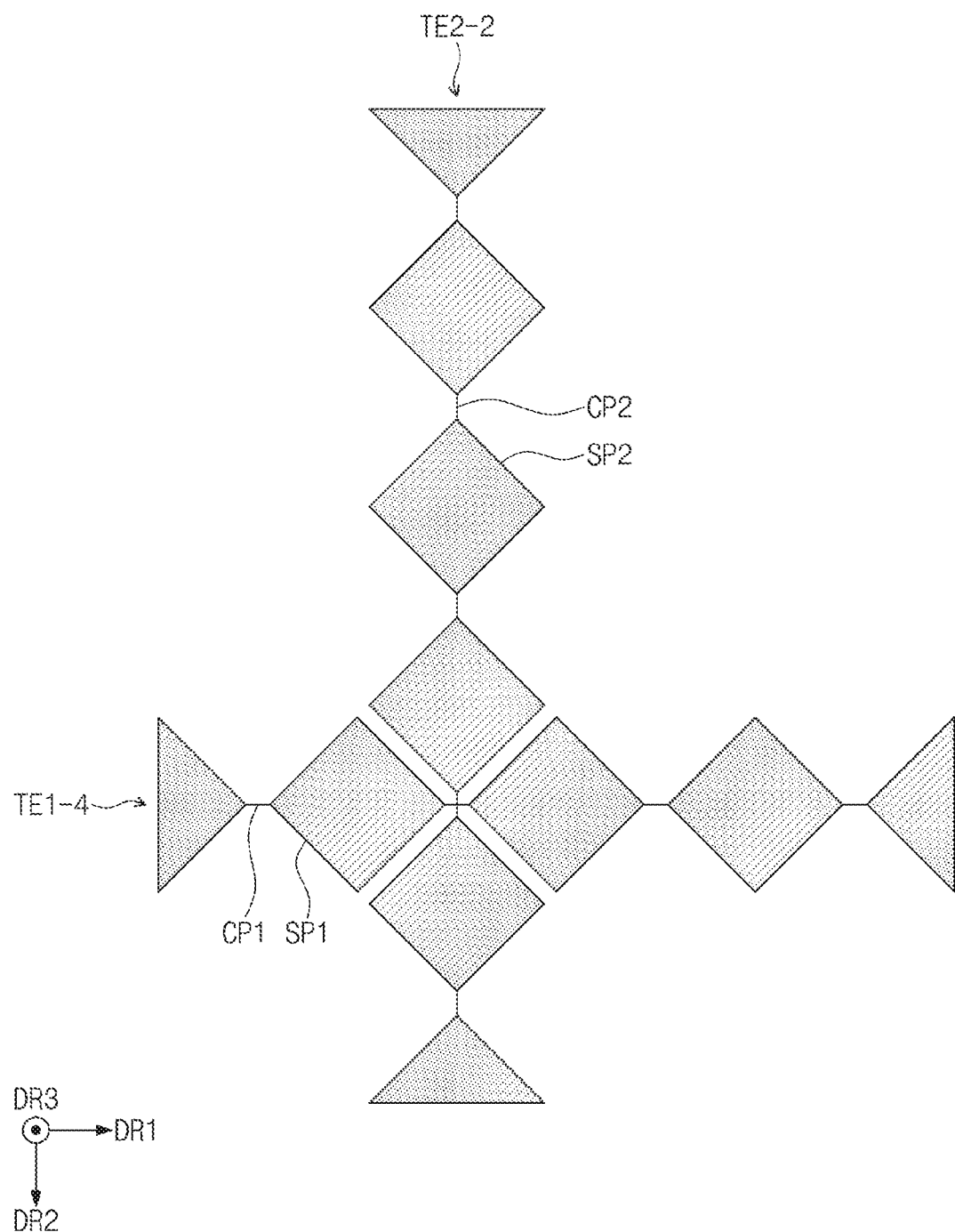
FIG. 9B is a plan view representing outlined areas of first and second electrodes of the input sensing unit of FIG. 9A according to some exemplary embodiments.
Figure 9C:
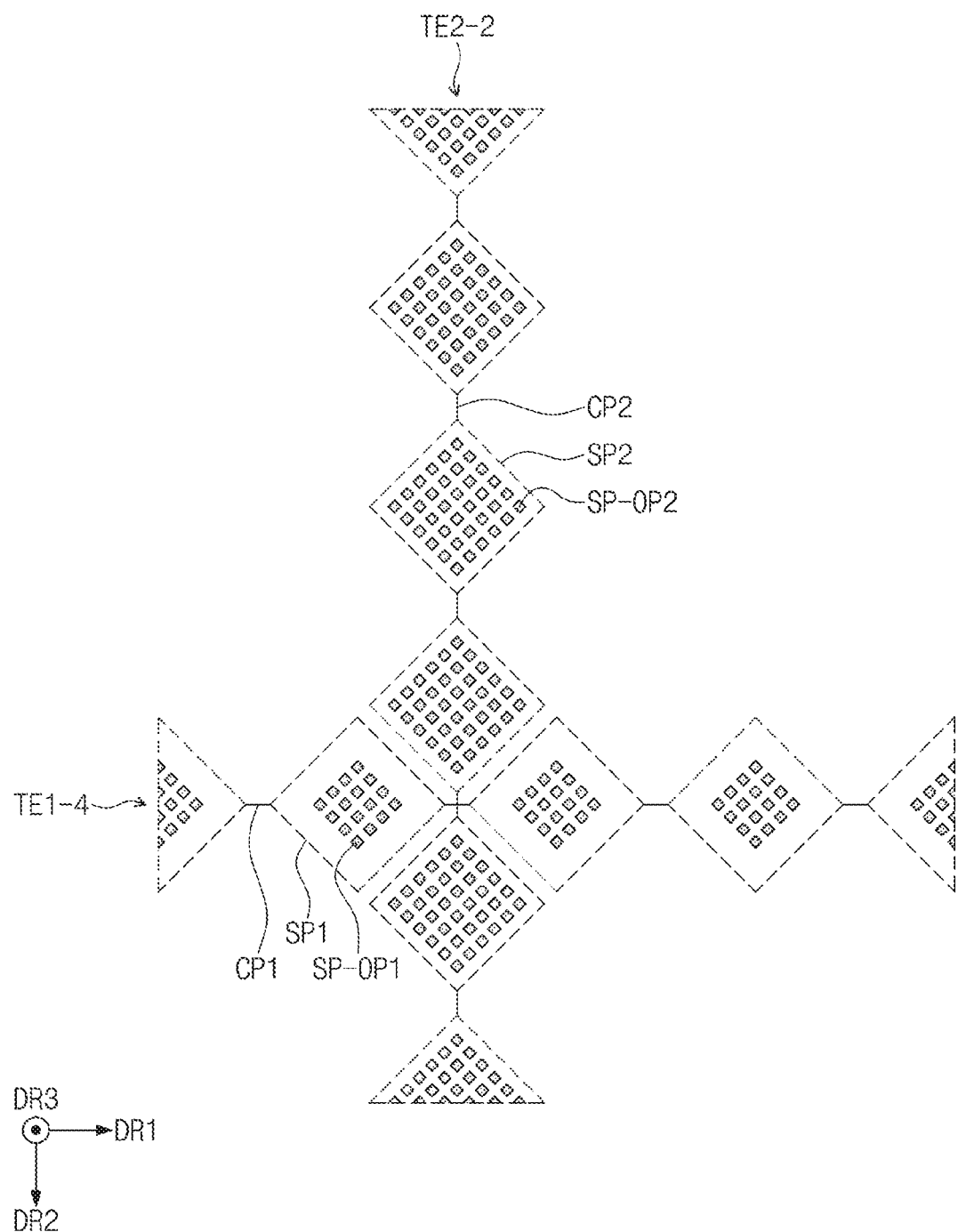
FIG. 9C is a plan view representing opening areas of the first and second electrodes of the input sensing unit of FIG. 9A according to some exemplary embodiments.
Figure 9D:
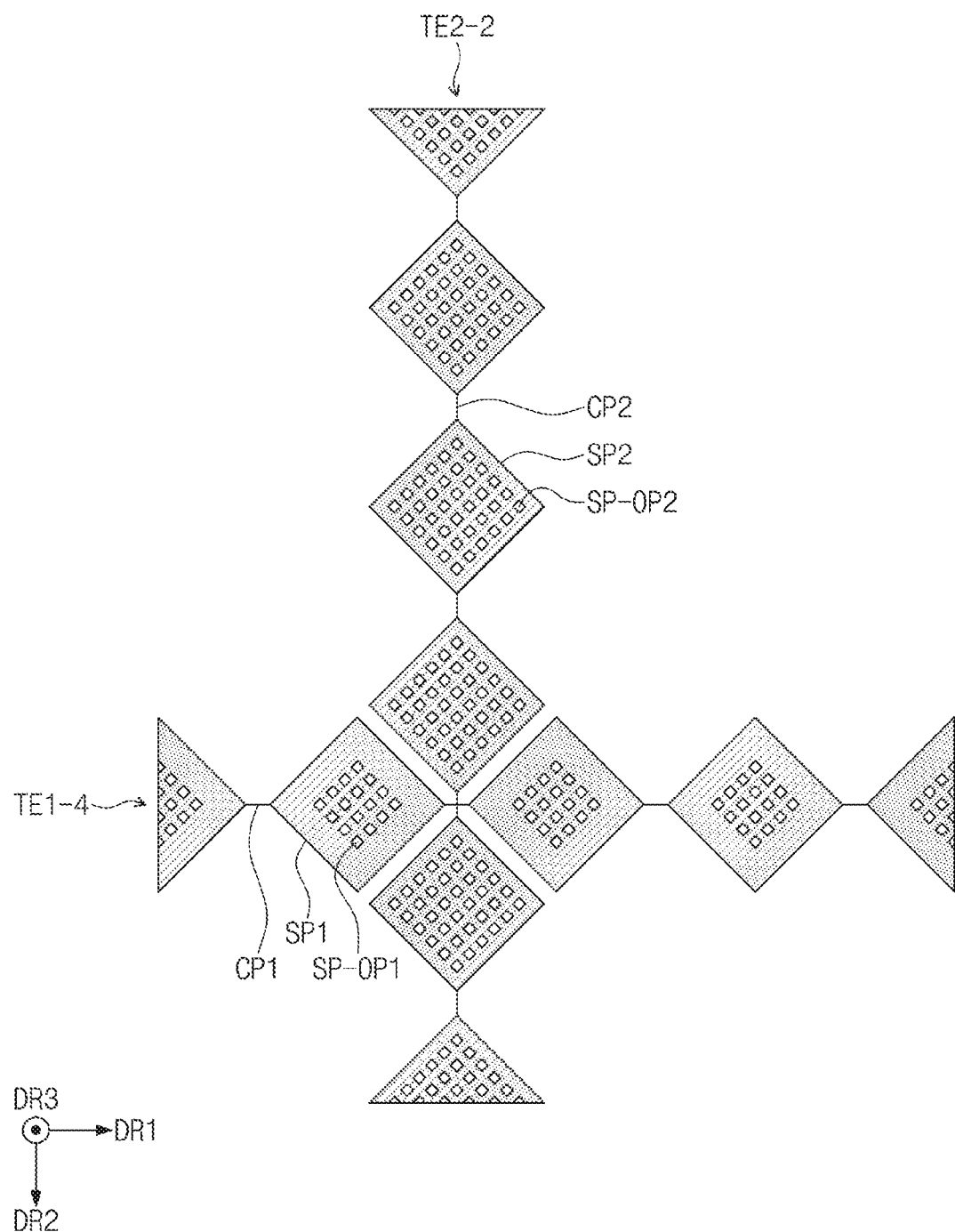
FIG. 9D is a plan view representing effective areas of the first and second electrodes of the input sensing unit of FIG. 9A according to some exemplary embodiments.
Figure 9E:
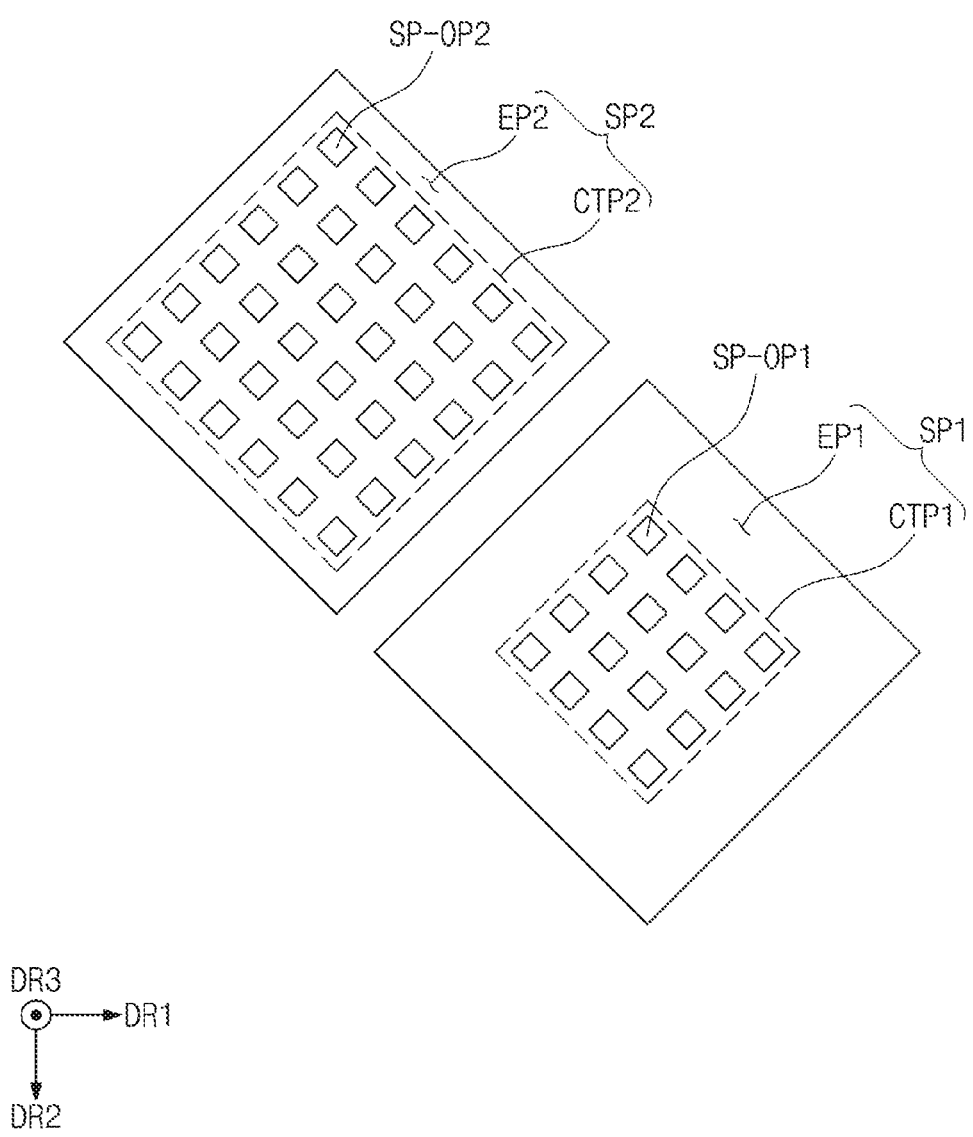
FIG. 9E is a plan view illustrating first and second sensing parts of the input sensing unit of FIG. 9A according to some exemplary embodiments.

FIG. 9A is a plan view of a portion of the input sensing unit of FIG. 6B according to some exemplary embodiments. FIG. 9B is a plan view representing outlined areas of first and second electrodes of the input sensing unit of FIG. 9A according to some exemplary embodiments. FIG. 9C is a plan view representing opening areas of the first and second electrodes of the input sensing unit of FIG. 9A according to some exemplary embodiments. FIG. 9D is a plan view representing effective areas of the first and second electrodes of the input sensing unit of FIG. 9A according to some exemplary embodiments. FIG. 9E is a plan view illustrating first and second sensing parts of the input sensing unit of FIG. 9A according to some exemplary embodiments. For instance, FIG. 9B provides a plan view representing outlined areas of the first electrode TE1-4 and the second electrode TE2-2, FIG. 9C provides a plan view representing the opening areas of the first electrode TE1-4 and the second electrode TE2-2, FIG. 9D provides a plan view representing the effective areas of the first electrode TE1-4 and the second electrode TE2-2, and FIG. 9E provides a plan view illustrating the first sensing part SP1 and the second sensing part SP2. In this manner, FIGS. 9A to 9E exemplarily illustrate the fourth, first electrode TE1-4 as a representative first electrode among the first electrodes TE1-1 to TE1-5 and the second, second electrode TE2-2 as a representative electrode among the second electrodes TE2-1 to TE2-4 illustrated in FIG. 6B.

As illustrated in FIGS. 9A and 9B, the second, second electrode TE2-2 has a larger outlined area (the area indicated by hatching in FIG. 9B) than the first, fourth electrode TE1-4. The areas of the second, second electrode TE2-2 and the first, fourth electrode TE1-4 may be determined according to the number of sensing parts respectively provided therein. In FIGS. 9A and 9B, the second, second electrode TE2-2 has the outlined area corresponding to five second sensing parts SP2, and the first, fourth electrode TE1-4 has the outlined area corresponding to four second sensing parts SP2. In some exemplary embodiments, the second sensing part SP2 and the first sensing part SP1 may have the same outlined area and shape.

As illustrated in FIGS. 9A and 9C, an opening area (an area indicated by hatching in FIG. 9C, hereinafter, a second opening area SP-OP2) of the second, second electrode TE2-2 is greater than an opening area (an area indicated by hatching in FIG. 9C, hereinafter, a first opening area SP-OP1) of the first, fourth electrode TE1-4. The first opening area SP-OP1 and the second opening area SP-OP2 may be defined such that the first and second effective areas to be described in relation to FIG. 9D are substantially identical.

The effective area (an area indicated by hatching in FIG. 9D, hereinafter the second effective area) of the second, second electrode TE2-2 illustrated in FIG. 9D may be substantially identical to the effective area (an area indicated by hatching in FIG. 9D, hereinafter the first effective area) of the first electrode TE1-4. The first and second effective areas may be respectively obtained by subtracting the first opening areas SP-OP1 and the second opening areas SP-OP2 shown in FIG. 9C from the first outlined area and the second outlined area shown in FIG. 9B. In addition, the effective area may be an area in which the mesh lines described in relation to FIGS. 8A to 8C are disposed. As used herein, the phrase "the effective areas are substantially identical" means that the effective areas are identical when they include the areas of the first connecting parts CP1 and the second connecting parts CP2, which are relatively smaller than those of the first sensing parts SP1 and the second sensing parts SP2.

Since the effective areas of the first, fourth electrode TE1-4 and the second, second electrode TE2-2 are identical, a deviation in parasitic capacitance Cbc generated in the first, fourth electrode TE1-4 and the second, second electrode TE2-2 (see FIG. 7C), which has been described in relation to FIG. 7C, may be reduced. Even if the first and second effective areas are not substantially identical, in order to reduce the deviation in the parasitic capacitance Cbc, the first effective area may be 95% to 105% of the second effective area.

Descriptions regarding the effective areas of the first sensing part SP1 and the second sensing part SP2 will be provided in relation to FIG. 9E. As described, the outlined areas and shapes of the first sensing part SP1 and the second sensing part SP2 may be identical. When the second, second electrode TE2-2 includes "X" second sensing parts SP2 and the first, fourth electrode TE1-4 includes "Y" first sensing parts SP1, the second, second electrode TE2-2 may have the outlined area of about X/Y×100% in comparison to the first, fourth electrode TE1-4. The second, second electrode TE2-2 illustrated in FIG. 9B may have the outlined area of about 125% in comparison to the first, fourth electrode TE1-4.

In order that the second, second electrode TE2-2 and the first, fourth electrode TE1-4 have substantially identical effective areas, the second sensing parts SP2 may have the effective area of about Y/X×100% in comparison to the first sensing parts SP1. The second sensing parts SP2 illustrated in FIG. 9B may have the effective area of about 80% in comparison to the first sensing parts SP1.

The first effective area is about 10% to about 70% in comparison to the first outlined area, and the second effective area is about 30% to 90% in comparison to the second outlined area. The first openings SP-OP1 and the second openings SP-OP2 illustrated in FIG. 9E have identical shapes, but exemplary embodiments are not limited thereto or thereby.

According to various exemplary embodiments of the input sensing unit TS described in relation to FIGS. 6A to 9E, a determination factor of the outlined area of a corresponding electrode is based on variations in the length of the corresponding electrode, but exemplary embodiments are not limited thereto or thereby. In some exemplary embodiments, the second length of the second electrodes TE2-1 to TE2-4 may not be longer than the first length of the first electrodes TE1-1 to TE1-5. In some exemplary embodiments, when the first electrodes TE1-1 to TE1-5 have the first outlined area and the first opening areas SP-OP1, the second electrodes TE2-1 to TE2-4 may have the second outlined area that is greater than the first outlined area, and have the second opening areas SP-OP2 that are greater than the first opening areas SP-OP1.

Figure 10:
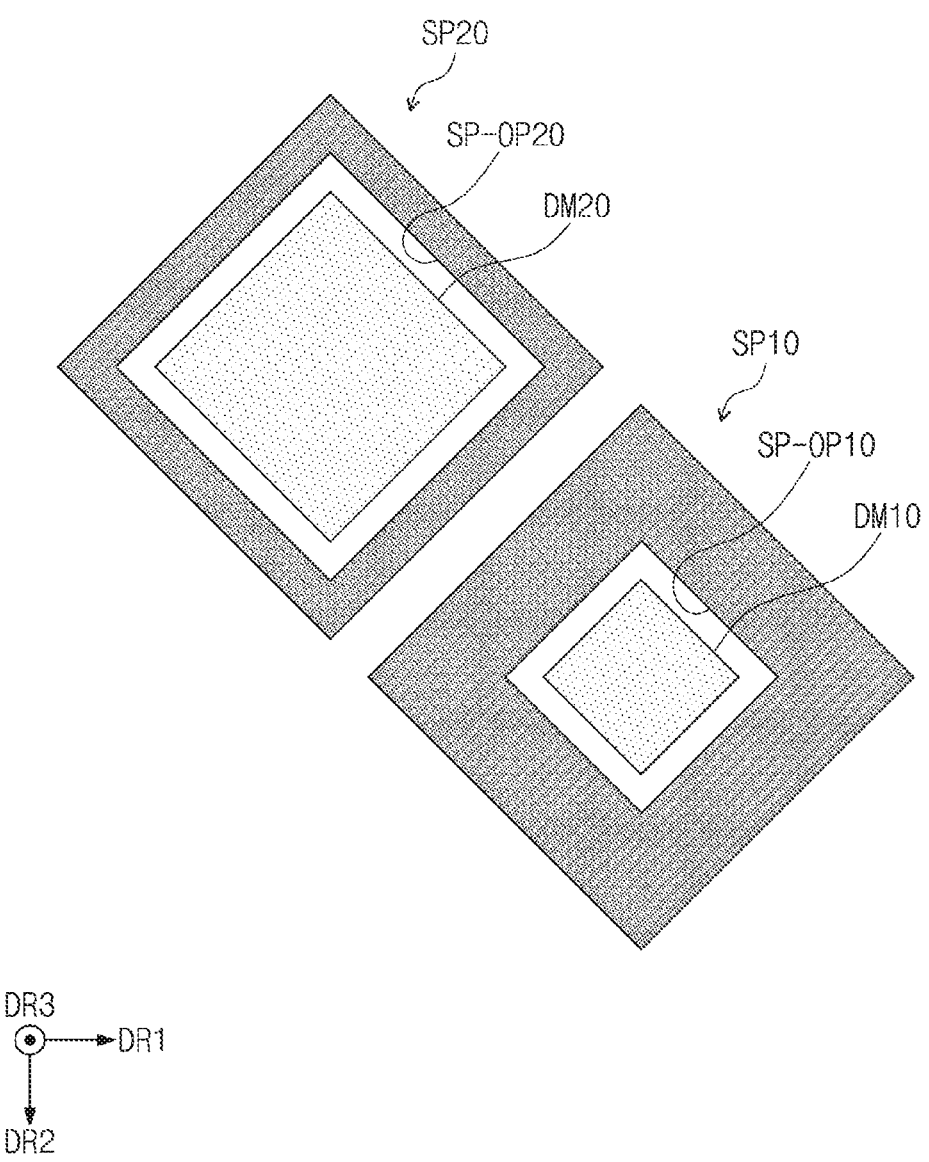
FIG. 10 is a plan view illustrating first and second sensing parts of an input sensing unit according to some exemplary embodiments.
Figure 11:
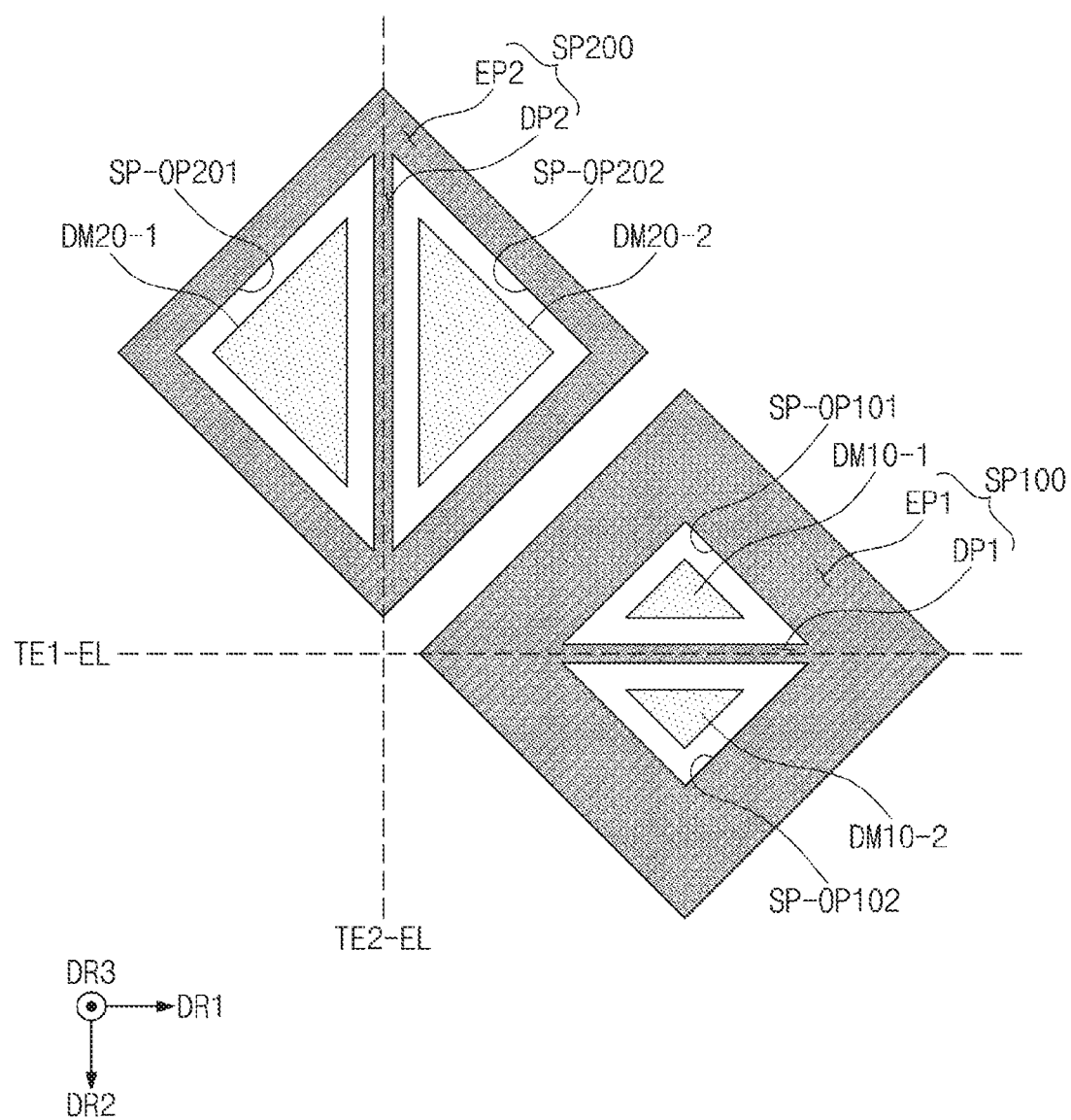
FIG. 11 is a plan view illustrating first and second sensing parts of an input sensing unit according to some exemplary embodiments.

FIG. 10 is a plan view illustrating first and second sensing parts of an input sensing unit according to some exemplary embodiments. FIG. 11 is a plan view illustrating first and second sensing parts of an input sensing unit according to some exemplary embodiments. The first and second sensing parts of FIGS. 10 and 11 are similar to the first sensing parts SP1 and the second sensing parts SP2 of FIGS. 1 to 9E, and, as such, primarily differences will be provided below to avoid obscuring exemplary embodiments.

The first sensing part SP10 and the second sensing part SP20 illustrated in FIG. 10 are the same as those including only the first edge part EP1 and the second edge part EP2 in comparison to the first sensing part SP1 and the second sensing part SP2 illustrated in FIG. 9E. A single opening SP-OP10 and a single opening SP-OP20 are respectively defined in the first sensing part SP10 and the second sensing unit SP20. A first dummy electrode DM10 and a second dummy electrode DM20 are respectively disposed inside the first opening SP-OP10 and the second opening SP-OP20. The first sensing part SP10, the second sensing part SP20, the first dummy electrode DM 10, and the second dummy electrode DM20 may have mesh shapes. The effective area of a first electrode including the first sensing part SP10 and the effective area of a second electrode including the second sensing part SP20 may be substantially identical.

The first sensing part SP100 illustrated in FIG. 11 may include the first edge part EP1 and a first direct pass part DP1, and the second sensing part SP200 may include the second edge part EP2 and a second direct pass part DP2. In this manner, two openings may be defined in each of the first sensing part SP100 and the second sensing part SP200.

As seen in FIG. 11, first openings SP-OP101 and SP-OP102 may be surrounded by the first edge part EP1 and may be separated with the first direct pass part DP1 disposed therebetween. Second openings SP-OP201 and SP-OP202 may be surrounded by the second edge part EP2 and may be separated with the second direct pass part DP2 disposed therebetween. The first direct pass part DP1 is disposed on an extension line TE1-EL of the first, fourth electrode TE1-4 (see FIG. 9A) and the second direct pass part DP2 may be disposed on an extension line TE2-EL of the second, second electrode TE2-2 (see FIG. 9A). The first direct pass part DP1 and the second direct pass part DP2 may prevent (or reduce) current paths from being blocked or detoured by openings (e.g., first openings SP-OP101 and SP-OP102 and second openings SP-201 and SP202) provided in corresponding sensing parts (e.g., first sensing parts SP100 and second sensing parts SP200).

First dummy electrodes DM10-1 and DM10-2 may be respectively disposed in the first openings SP-OP101 and SP-OP102, and second dummy electrodes DM20-1 and DM20-2 may be respectively disposed in the second openings SP-OP201 and SP-OP202. The first sensing part SP100, the second sensing part SP200, the first dummy electrodes DM10-1 and DM10-2, and the second dummy electrodes DM20-1 and DM20-2 may have mesh shapes. The effective area of a first electrode including the first sensing parts SP100, and the effective area of a second electrode including the second sensing parts SP200 may be substantially identical.

According to various exemplary embodiments, noise associated with an electrode disposed in a display panel may be reduced by defining an opening in an electrode at least because parasitic capacitance between the electrode and a cathode of an organic light emitting diode is reduced. Likewise, a foldable display module, even if the thickness of a thin film encapsulation layer is decreased, may be provided with a signal-to-noise ratio that may be increased. Further, a noise deviation caused by a cathode may be generated between first and second electrodes with different lengths. In this manner, the noise deviation may be reduced by providing openings with different areas in the first and second electrodes.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display module comprising:
   a display panel; and
   an input sensing unit directly disposed on the display panel without an adhesive layer therebetween,
   wherein the input sensing unit comprises:
   a first electrode extending in a first direction, the first electrode comprising a first opening area, the first opening area being an area that at least one opening is formed in the first electrode;
   a second electrode extending in a second direction intersecting the first direction, the second electrode being longer than the first electrode, the second electrode comprising a second opening area of a size greater than a size of the first opening area, the second opening area being an area that at least one opening is formed in the second electrode; and
   an insulation layer configured to insulate the first electrode from the second electrode.

2. The display module of claim 1, wherein:
   the first electrode is formed of first mesh lines; and
   the second electrode is formed of second mesh lines.

3. The display module of claim 2, wherein an effective area in which the first mesh lines of the first electrode are disposed is substantially identical to an effective area in which the second mesh lines of the second electrode are disposed.

4. The display module of claim 2, wherein:
   the display panel comprises:
   light emitting areas separated from each other; and
   a non-light emitting area disposed between the light emitting areas; and
   each of the first mesh lines and the second mesh lines overlap the non-light emitting area.

5. The display module of claim 1, further comprising:
   a first dummy electrode; and
   a second dummy electrode,
   wherein the first opening area is defined by at least one first opening and the first dummy electrode is disposed in the at least one first opening, and
   wherein the second opening area is defined by at least one second opening and the second dummy electrode is disposed in the at least one second opening.

6. The display module of claim 5, wherein:
   the first opening is one of a plurality of first openings in the first opening area; and
   the first dummy electrode is one of a plurality of first dummy electrodes, the plurality of first dummy electrodes being respectively disposed in the plurality of first openings.

7. The display module of claim 5, wherein:
   the first dummy electrode comprises first mesh lines; and
   the second dummy electrode comprises second mesh lines.

8. The display module of claim 1, wherein:
   the first electrode comprises:
   "Y" first sensing parts arrayed in the first direction, "Y" being a natural number greater than or equal to two, each first sensing part of the "Y" first sensing parts comprising at least one first opening defined therein; and
   first connecting parts connecting adjacent first sensing parts among the "Y" first sensing parts; and
   the second electrode comprises:
   "X" second sensing parts arrayed in the second direction, "X" being a natural number greater than "Y," each second sensing part of the "X" second sensing parts comprising at least one second opening defined therein; and
   second connecting parts connecting adjacent second sensing parts among the "X" second sensing parts.

9. The display module of claim 8, wherein:
   the first electrode is defined by a first outlined area;
   the second electrode is defined by a second outlined area; and
   a size of the second outlined area is about X/Y×100% in comparison to a size of the first outlined area.

10. The display module of claim 8, wherein:
    each of the "Y" first sensing parts comprises a first outlined area;
    each of the "X" second sensing parts comprises a second outlined area,
    each of the "Y" first sensing parts is defined by a first effective area, the first effective area being defined as the first outlined area excluding an area of the at least one first opening;
    each of the "X" second sensing parts is defined by a second effective area, the second effective area being defined as the second outlined area excluding an area of the at least one second opening; and
    the second effective area is smaller than the first effective area.

11. The display module of claim 10, wherein a size of the second effective area is about Y/X×100% in comparison to a size of the first effective area.

12. The display module of claim 10, wherein:
a size of the first effective area is about 10% to about 70% of a size of the first outlined area; and
a size of the second effective area is about 30% to about 90% of a size of the second outlined area.

13. The display module of claim 10, wherein a size of the first outlined area is substantially equivalent to a size of the second outlined area.

14. The display module of claim 8, wherein:
the insulation layer comprises a first insulation layer and a second insulation layer;
one of the first connecting parts and the second connecting parts is disposed on a base surface of the display panel;
the first insulation layer is disposed on the one of the first connecting parts and the second connecting parts, the "Y" first sensing parts, the "X" second sensing parts;
the other of the first connecting parts and the second connecting parts is disposed on the first insulation layer; and
the second insulation layer is disposed on the "Y" first sensing parts, the "X" second sensing parts, and the other of the first connecting parts and the second connecting parts.

15. The display module of claim 8, wherein:
the at least one first opening is defined as two separate first openings;
each of the "Y" first sensing parts comprises:
an edge part surrounding the two separate first openings; and
a direct pass part disposed between the two separate first openings; and
the direct pass part is disposed on an extension line of the first electrode.

16. The display module of claim 1, further comprising:
a first signal line connected to an end of the first electrode; and
second signal lines respectively connected to opposing ends of the second electrode.

17. The display module of claim 1, wherein the display panel and the input sensing unit are bent about a bending axis.

18. The display module of claim 1, wherein:
the display panel comprises a cathode electrode;
intermediate insulation layers are disposed between the cathode electrode and the first electrode; and
a sum of thicknesses of the intermediate insulation layers is about 0.5 μm to about 30 μm.

19. The display module of claim 1, wherein:
the display panel comprises:
a base layer;
a circuit element layer on the base layer;
a display element layer on the circuit element layer; and
a thin film encapsulation layer on the display element layer;
the display element layer comprises:
a first display electrode;
an organic light emitting layer on the first display electrode; and
a second display electrode disposed between the organic light emitting layer and the thin film encapsulation layer; and
a distance between the first electrode of the input sensing unit and the second display electrode is about 0.5 μm to about 30 μm.

20. A display module comprising:
a display panel providing a base surface; and
an input sensing unit directly disposed on the base surface,
wherein the input sensing unit comprises:
a first electrode extending in a first direction, the first electrode comprising a first outline area and a first opening area, the first opening area being an area that at least one opening is formed in the first electrode; and
a second electrode extending in a second direction intersecting the first direction, the second electrode comprising a second outline area of a size greater than a size of the first outline area, and a second opening area of a size greater than a size of the first opening area, the second opening being an area that at least one opening is formed in the second electrode.

* * * * *